(12) United States Patent
Arbore et al.

(10) Patent No.: US 6,665,320 B1
(45) Date of Patent: Dec. 16, 2003

(54) WIDEBAND TUNABLE LASER SOURCES WITH MULTIPLE GAIN ELEMENTS

(75) Inventors: Mark A. Arbore, Los Altos, CA (US); Charles Harb, Sunnyvale, CA (US); Jeffrey D. Kmetec, Palo Alto, CA (US)

(73) Assignee: Lightwave Electronics, Mountain View, CA (US)

( * ) Notice: Subject to any disclaimer, the term of this patent is extended or adjusted under 35 U.S.C. 154(b) by 116 days.

(21) Appl. No.: 09/772,452

(22) Filed: Jan. 29, 2001

(51) Int. Cl.$^7$ .............................. H01S 3/30; H01S 3/10; H01S 3/14

(52) U.S. Cl. ................................. 372/20; 372/6; 372/68

(58) Field of Search ................................ 372/6, 20, 68; 385/24, 37; 359/115, 124, 130, 341.1

(56) References Cited

U.S. PATENT DOCUMENTS

| | | | |
|---|---|---|---|
| 5,319,668 A | | 6/1994 | Luecke ........................ 372/107 |
| 5,379,310 A | * | 1/1995 | Papen et al. .................. 372/23 |
| 6,115,401 A | | 9/2000 | Scobey et al. ............... 372/100 |
| 6,134,250 A | | 10/2000 | Koren et al. .................... 376/6 |
| 6,212,310 B1 | * | 4/2001 | Waarts et al. .................. 385/24 |

OTHER PUBLICATIONS

Daneu et al., *Spectral beam combing of a broad–stripe diode laser array in an external cavity*, CLEO (Conference on Lasers and Electro–Optics) Technical Digest, Paper #CWA4, pp. 242–243, May 7–12, 2000.

* cited by examiner

*Primary Examiner*—Paul Ip
*Assistant Examiner*—Armando Rodriguez
(74) *Attorney, Agent, or Firm*—Lumen Intellectual Property Services, Inc.

(57) ABSTRACT

This invention provides a tunable laser in which a plurality of gain elements (e.g., semiconductor diodes) with a plurality of gain spectra are optically coupled to a splitting-combining means (e.g., a wavelength router or fiber-optic coupler) in parallel, and the splitting-combining means is in optical communication with a wavelength-selecting means (e.g., a diffraction grating optically coupled to a movable mirror). The tunable laser of the present invention further comprising an optical fiber, optically coupling the splitting-combining means to the wavelength-selecting means. The use of a plurality of distinct gain spectra greatly enhances the tuning range of the tunable laser in the present invention. Moreover, by employing a long optical fiber as a substantial portion of an external cavity, the axial-mode spacing in the laser cavity is so small that mode-hops are effectively inconsequential for practical purposes, thereby rendering the wavelength tuning to be effectively continuous in the tunable laser of the present invention. Additionally, the availability of a plurality of the gain spectra can be further exploited, so as to provide additional capabilities in wavelength selecting/tuning. As such, the present invention provides a versatile and robust tunable laser in a simple and low cost construction.

51 Claims, 16 Drawing Sheets

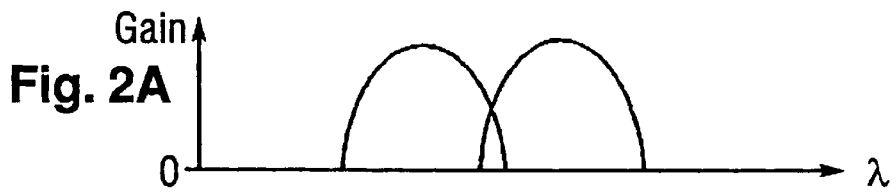
Fig. 2A
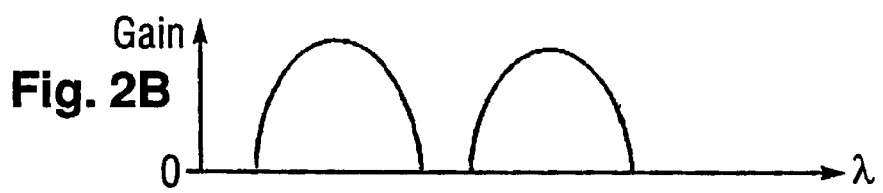
Fig. 2B
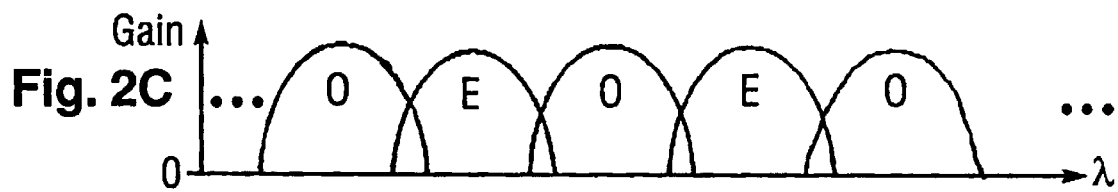
Fig. 2C
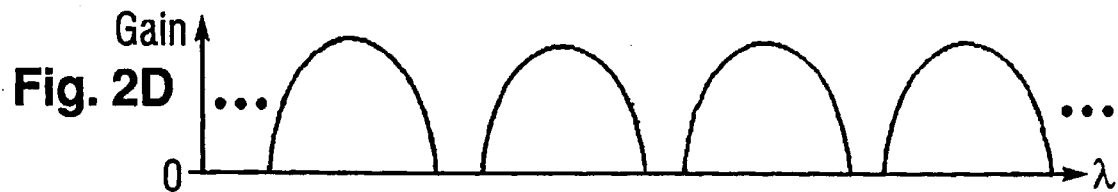
Fig. 2D
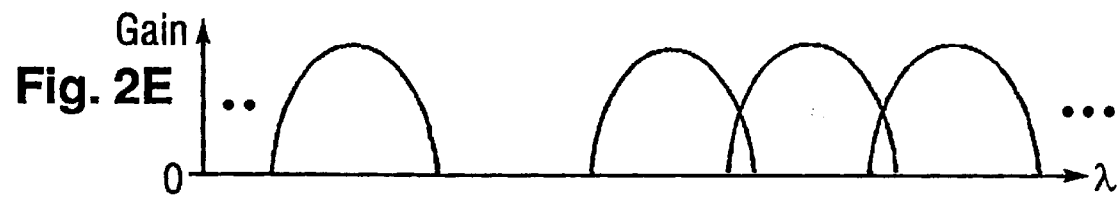
Fig. 2E
Fig. 2A-2E

WIDEBAND TUNABLE LASER SOURCES WITH MULTIPLE GAIN ELEMENTS

FIELD OF THE INVENTION

The present invention relates generally to laser systems. More specifically, it relates to a novel class of tunable lasers that can provide effectively continuous tuning in a tuning range spanning multiple gain spectra in a simple, versatile, and economical way. Such novel tunable lasers are particularly suited for fiber-optic networks and telecommunication component testing applications.

BACKGROUND OF THE INVENTION

As fiber-optic networks employing wavelength division multiplexing (WDM) become increasingly pervasive as the backbone of modern communications systems, there is a growing demand for tunable laser sources that can provide a wide range of wavelengths in a simple, versatile, and economical way. Such tunable laser sources are desired, for instance, in swept-wavelength testing of passive and active telecommunication components. Tunable laser sources are also employed in multi-channel coherent communication systems, spectroscopic measurements, and optical amplifier characterizations.

Extended (or external) cavity diode lasers (ECDLs) are conventionally employed in the art to provide tunable laser sources for swept-wavelength testing in telecommunications and other applications. For purpose of elucidating the principle and the distinct features of the present invention, the underlying principle of operation of ECDLs is briefly described below. A more detailed description of external cavities is well documented in the art, for example, in "Spectrally Narrow Pulsed Dye Laser without Beam Expander" by Littman et al., Applied Optics, vol.17, no.14, pp.2224–2227, Jul. 15 1978; "Novel geometry for single-mode scanning of tunable lasers" by Littman et al., Optics Letters, vol.6, no.3, pp.117–118; "External-Cavity diode laser using a grazing-incidence diffraction grating" by Harvey et al., Optics Letters, vol.16, no.12, pp.910–912; and "Widely Tunable External Cavity Diode Lasers" by Day et al., SPIE, Vol. 2378, pp.35–41.

In a tunable ECDL, as the name suggests, the wavelength selection and tuning functions are external to the gain element where the laser action takes place. Such a system typically utilizes an external cavity of variable length in conjunction with a diffraction grating and a movable mirror (or simply-a movable diffraction grating), all external to a semiconductor diode (serving as a gain element). An incident laser beam is diffracted by the grating. A diffracted beam with the desired wavelength is selected by the movable mirror, further reflected back onto the diffraction grating, and subsequently transmitted back to the semiconductor diode where further amplification takes place. Rotation and/or translation of the movable mirror enables the system to be tuned to different wavelengths. (Alternatively, the movable diffraction grating is rotated/translated, to provide tunability in wavelength.) The ultimate limit to the tuning range is set by the gain spectrum of the semiconductor diode.

In an ECDL, the number of nodal points of the standing wave in the laser cavity is proportional to $L/\lambda$, where $\lambda$ is the operating wavelength and L is the total optical length of the laser cavity (primarily provided by the length $L_{ext}$ of the external cavity). Therefore, if the wavelength tuning takes place while L is maintained constant, the number of nodal points in the laser cavity changes discontinuously. That is, the wavelength cannot be continuously varied, but rather, it leaps in discrete steps—termed as mode-hops. As a result, it is often difficult to tune in a desired wavelength, and there may also be substantial fluctuations in the output power of the laser. Mode-hops can be avoided by varying the length L of the laser cavity as the wavelength tuning takes place (such that as the tuning passband of the diffraction grating shifts in response to the tuning, the underlying axial modes of the laser cavity follow accordingly), in a coordination that requires great accuracy and stringent tolerance. Coordinating the wavelength tuning and the cavity-length changing in ECDLs has been a rather arduous and expensive undertaking.

Efforts have been made in the art to preventing mode-hops and thereby providing more continuous tuning, as exemplified by U.S. Pat. Nos. 5,172,390, 5,319,668, 5,347,527, 5,491,714, 5,493,575, 5,594,744, 5,862,162, 5,867,512, 6,026,100, 6,038,239, 6,115,401, and 6,134,250. For example, U.S. Pat. No. 5,319,668 describes an external cavity semiconductor laser, comprising a semiconductor laser diode, a diffraction grating and a movable mirror. The movable mirror is mounted on a pivot so positioned to provide simultaneous rotation and linear translation, thereby enabling continuous single-mode tuning. The mirror pivot point is determined by a detailed calculation which takes into account a number of factors in the laser cavity, so as to maintain a precise control of the length of the laser cavity. U.S. Pat. No. 5,347,527 discloses a tunable external cavity laser source and a process for adjusting the laser source, such that continuous tunability can be provided. U.S. Pat. No. 5,867,512 describes an external cavity semiconductor laser and an elaborate tuning arrangement for avoiding mode-hops. Particular effort is made in this patent to correct the chromatic dispersion effects in the laser cavity. The appearance of these prior art patents (along with many others) in fact serve as a testimony of the difficulty with combating mode-hops in ECDLs.

U.S. Pat. No. 6,115,401 discloses a laser system, in which a gain medium (such as a semiconductor diode) is optically coupled to an external cavity containing a monolithic prism assembly. The monolithic prism assembly, including a transparent substrate carrying a Fabry-Perot thin film interference filter, plays the role of the diffraction grating in a conventional ECDL (as described above). Translation of the monolithic prism assembly provides continuous mode-hop-free tuning of the laser operating wavelength. The intent of this invention is to make a compact single-frequency tunable laser with very narrow linewidths, primarily aiming at dense wavelength division multiplexing (DWDM) applications.

U.S. Pat. No. 6,134,250 describes a single-mode wavelength selectable ring laser, which operates at a single wavelength selectable from any channel passband of a multiple-channel wavelength multiplex/demultiplex element (e.g., an arrayed waveguide grating router (AWGR)). A Fabry-Perot semiconductor optical amplifier (FP-SOA) is connected to AWGR to form a ring laser structure, where FP-SOA is used as an intra-cavity narrow-band mode-selecting filter to stabilize the laser oscillation to a single axial mode. As such, this ring laser system can only provide discrete tuning from one wavelength passband of the wavelength filter to another. That is, continuous tuning cannot be achieved in this system. It should be noted that although this prior art patent discloses a configuration in which several semiconductor optical amplifiers (SOAs) are implemented in a demultiplexer AWGR, each of the SOAs is dedicated to amplify an optical signal with a particular wavelength. That is, these SOAs function merely as wavelength switches. And more important is the fact that the overall tuning range of this laser system is limited by the single gain spectrum of FP-SOA. Hence, this prior art laser system is suited as providing a wavelength-selectable laser, as opposed to a tunable laser.

Daneu et al. in "Spectral beam combining of a broadstrip diode laser in an external cavity", CLEO 2000, describes a "spectral beam combining" laser system, in which several diode lasers placed in parallel are being used simultaneously, each having the identical gain spectrum but lasing at a different wavelength. By having several lasers operating simultaneously, the collective output beam of the system has many wavelengths superimposed, thereby providing a higher power. However, the overall tuning range of this system is no more than what a single diode is able to provide. Moreover, the external cavity in this case does not employ an optical fiber.

Despite various efforts that have been undertaken, the prior art ECDLs still suffer a number of shortcomings, summarized as follows:

a) Since only one gain element (e.g., a semiconductor laser diode) is employed, or only one gain spectrum is effectively in action, the overall tuning range in the prior art ECDLs is rather limited. As a way of example, these ECDLs typically have tuning ranges of 50–100 nm in wavelength (centered about 1550 nm for telecommunications applications). A wider tuning range is in demand for many applications. For instance, the next-generation telecommunications components would require testing over a tuning range of at least 250 nm.

b) In the prior art ECDLs intended to provide continuous tuning, the axial-mode spacing is typically on the order of several GHz, which imposes a tuning resolution that is too large for many applications (such as swept-wavelength testing of telecommunication components) to tolerate. In order to prevent mode-hops and thereby provide more continuous tuning, an elaborate mechanism must be implemented in an ECDL, which requires stringent mechanical tolerance and painstaking adjustment. Such stringent tolerance and intricate alignment further render the ECDL thus constructed highly vulnerable to even minor errors in adjustment.

c) The prior art ECDLs typically have very narrow linewidths (e.g., less than 1 MHz), which not only are unnecessary in many practical applications, but also inadvertently introduce adverse effects. For instance, in applications where light is launched into an optical fiber and propagates over a long distance at low power, or over a short distance at high power, the presence of narrow linewidths along with either of these conditions renders the system susceptible to unwanted stimulated brilliuon scattering (SBS). Narrow linewidths may also be a disadvantage in a complex system, where there are lengthy etalons disposed between various components and/or interfaces.

These shortcomings render the prior art ECDLs difficult and expensive to build and implement in practice, and impede their wider applications.

In view of the foregoing, there is a need for a tunable laser source that overcomes the prior art problems in a simple and low cost construction.

SUMMARY

The aforementioned need in the art is provided by a tunable laser of the present invention, comprising a plurality of gain elements having a plurality of gain spectra, a splitting-combining means, and a wavelength-selecting means. The gain elements are optically coupled to the splitting-combining means in parallel, and the splitting-combining means is in optical communication with the wavelength-selecting means. The gain spectra are mutually distinct in general, so as to provide a wider tuning range. The tunable laser of the present invention further comprises an axial-mode control means, for determining the axial-mode structure of the laser cavity.

In this specification and appending claims, two gain spectra are said to be "distinct", if there is at least one wavelength at which one of the two gain spectra displays practically significant (positive) gain while the other one does not. Two distinct gain spectra can be "partially overlapping" in wavelength: that is, there are one or more wavelengths at which both of the gain spectra displaying practically significant (positive) gain. Two distinct gain spectra can alternatively be "substantially non-overlapping": namely, there is no common wavelength at which both of the two gain spectra display positive gain. Moreover, a plurality of gain spectra are said to be "mutually distinct", if each member of the gain spectra is "distinct" with respect to all other members of the gain spectra. This can be provided, for instance, by a plurality of gain spectra that are partially overlapping in a successive and incremental manner along wavelength. It can also be provided by a plurality of gain elements that are substantially non-overlapping in wavelength, thereby providing a plurality of discrete gain spectra. It can be further provided by a plurality of gain spectra in which some members of the gain spectra are partially overlapping, while others are substantially non-overlapping in wavelength.

In the present invention, the gain elements can be selected from the group of solid state gain media such as semiconductor diodes, doped fibers, doped crystals, doped glasses, and the like known in the art. The wavelength-selecting means can be provided by a diffraction grating, a prism, an acousto-optic filter, a tunable interference filter, a tunable birefrigent filter, a tunable etalon, or other wavelength-selecting elements known in the art. The splitting-combining means can be a fiber-optic coupler, a wavelength-division-multiplexing (WDM) coupler, a wavelength router, an active switching means, or a combination of these elements.

In general, the splitting-combining means should be configured such that there are N (N≧2) I-ports and M (M≧1) O-ports. The N I-ports are connected to N gain elements in a one-to-one correspondence. One of the O-ports is connected to the wavelength-selecting means, and any of the remaining (M−1) O-ports may be utilized to provide one or more output ports for the laser system. The splitting-combining means serves two functions: 1) at a given time, it routes/splits a back-coupled beam transmitted from the wavelength-selecting means along one or more paths and passes one or more sub-beams thus obtained into one or more gain elements; and 2) it combines the light amplified by one or more gain elements into a forward-coupled beam and directs the forward-coupled beam to the wavelength-selecting means. Furthermore, in the course of wavelength tuning, the splitting-combining means splits/routes the back-coupled beams along two or more paths into two or more gain elements. For instance, if an N×M fiber-optic coupler is used to provide a splitting-combining means, a back-coupled beam is (nearly) uniformly split along N paths, and the N sub-beams thus created are directed to all N gain elements. By contrast, if a wavelength-dependent element such as a wavelength router is used to serve as a splitting-combing means, a back-coupled beam with the selected wavelength at a given time may be routed only to a specific gain element which is capable of providing further amplification at the selected wavelength.

In the present invention, the axial-mode control means may be provided by an optical fiber interposed between, and in optical communication with, the splitting-combining means and the wavelength-selecting means, thereby serving as a substantial portion of an external cavity. The length of the optical fiber can be used to control the axial-mode structure of the laser cavity, for the spacing between two adjacent axial modes is given by c/2L, where c is the speed of light and L is the total optical length of the laser cavity. The length of the optical fiber can be further varied by coupling a piezoelectric fiber stretcher to the fiber, as a way of example. The axial-mode control means can alternatively (or additionally) be provided by a dispersive means, comprising one or more elements selected from the group of prisms, diffraction gratings, high-dispersion fibers, dispersive materials, and the like known in the art. The axial-mode control means can be further provided by an active-modulation means, including one or more elements selected from the group of pump-source-gain-modulation elements, piezoelectric modulators, electro-optic modulators, and acousto-optic modulators, and other modulation elements known in the art.

The tunable laser of the present invention operates as follows. A forward-coupled laser beam is transmitted from the gain elements (e.g., N semiconductor diodes) to the wavelength-selecting means (e.g, a diffraction grating optically coupled to a movable mirror) by way of the splitting-combining beams (e.g., an N×M fiber-optic coupler). As a way of example to illustrate the general principle of the present invention, the gain elements are characterized by a plurality of gain spectra that are mutually distinct (e.g., the gain spectra are partially overlapping in a successive manner along wavelength); and the axial-mode control means is provided by a long optical fiber optically coupling the splitting-combining means to the wavelength-selecting means. The wavelength-selecting means in turn transmits a back-coupled beam with the selected wavelength back to the splitting-combining means via the optical fiber. The splitting-combining means further directs the back-coupled beam into one or more gain elements. Further amplification takes place in one or more gain elements whose gain spectra provide significant (positive) gain at the selected wavelength. Subsequent rotation and/or translation of the movable mirror selects a different wavelength, which is further amplified by one or more different gain elements whose gain spectra show significant gain at the subsequent-selected wavelength. Hence, as the wavelength is tuned by way of the wavelength-selecting means, the constituent gain elements with distinct gain spectra take turns to amplify the successively selected wavelengths. As such, the availability of a plurality of gain elements and hence a plurality of distinct gain spectra greatly enhances the tuning range of the laser system of the present invention.

Moreover, by employing a long optical fiber to provide a substantial portion of the external cavity in a tunable laser of the present invention, the resulting axial-mode spacing is so small that mode-hops become inconsequential for practical purposes. This not only enables the wavelength tuning to be effectively continuous, but also greatly simplifies the construction and thereby lowers the cost of the tunable laser of the present invention.

Additionally, by choosing the gain elements with appropriate gain spectra and/or utilizing the gain spectra according to predetermined schemes in the course of wavelength tuning, the tunable laser of the present invention attains a versatile tunability that is unprecedented in the prior art systems. For example, by utilizing a plurality of gain spectra that are partially overlapping in a successive and incremental manner along wavelength, the tunable laser of the present invention provides a continuous-tuning laser source with a tuning range that can be arbitrarily chosen. Alternatively, by using a plurality of gain spectra that are substantially non-overlapping in wavelength, the tunable laser of the present invention effectively acts as a wavelength-selectable laser source, which is capable of providing a wide selection of output wavelengths.

Moreover, the gain elements can be divided into groups according to their gain spectra, and different groups are then alternately turned off while the wavelength tuning takes place. This way of operation ensures that only one gain element is in action during operation, thereby preventing the cross-over noise (such as mode-beating) that tends to arise when two gain elements are simultaneously in action. It may be further used to provide alternate collections of output wavelengths. All in all, the availability of a plurality of gain elements and hence a plurality of distinct gain spectra provides addition avenues for wavelength selecting/tuning, thereby imparting greater utility to the tunable laser of the present invention.

As such, the tunable laser of the present invention provides many advantages over the prior art tunable laser systems, summarized as follows:

By advantageously employing a plurality of gain elements with a plurality of distinct gain spectra, the tunable laser of the present invention provides a wide tuning range that is effectively all-wavelength available. As a way of example, a tuning range of at least 200 nm can be achieved in a tunable laser of the present invention.

By utilizing a long optical fiber as a substantial portion of an external cavity, the axial-mode spacing becomes so small that mode-hops can be effectively ignored in a tunable laser of the present invention. This removes the need for an intricate construction with stringent tolerance that is prevalent in the prior art ECDLS, thereby rendering the tunable laser of the present invention a simpler and lower cost construction.

By advantageously exploiting the availability of a plurality of distinct gain spectra according to various predetermined schemes, the tunable laser of the present invention can be configured as a continuous-tuning laser source, a wavelength-selectable laser source, or a switchable laser source providing various collections of desirable wavelengths.

All in all, the present invention provides a versatile and robust tunable laser in a simple and low cost construction.

The novel features of this invention, as well as the invention itself, will be best understood from the following drawings and detailed description.

BRIEF DESCRIPTION OF THE FIGURES

FIGS. 2A–2E provide several exemplary illustrations of a plurality of gain spectra, each displaying (positive) gain as a function of wavelength;

DETAILED DESCRIPTION

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
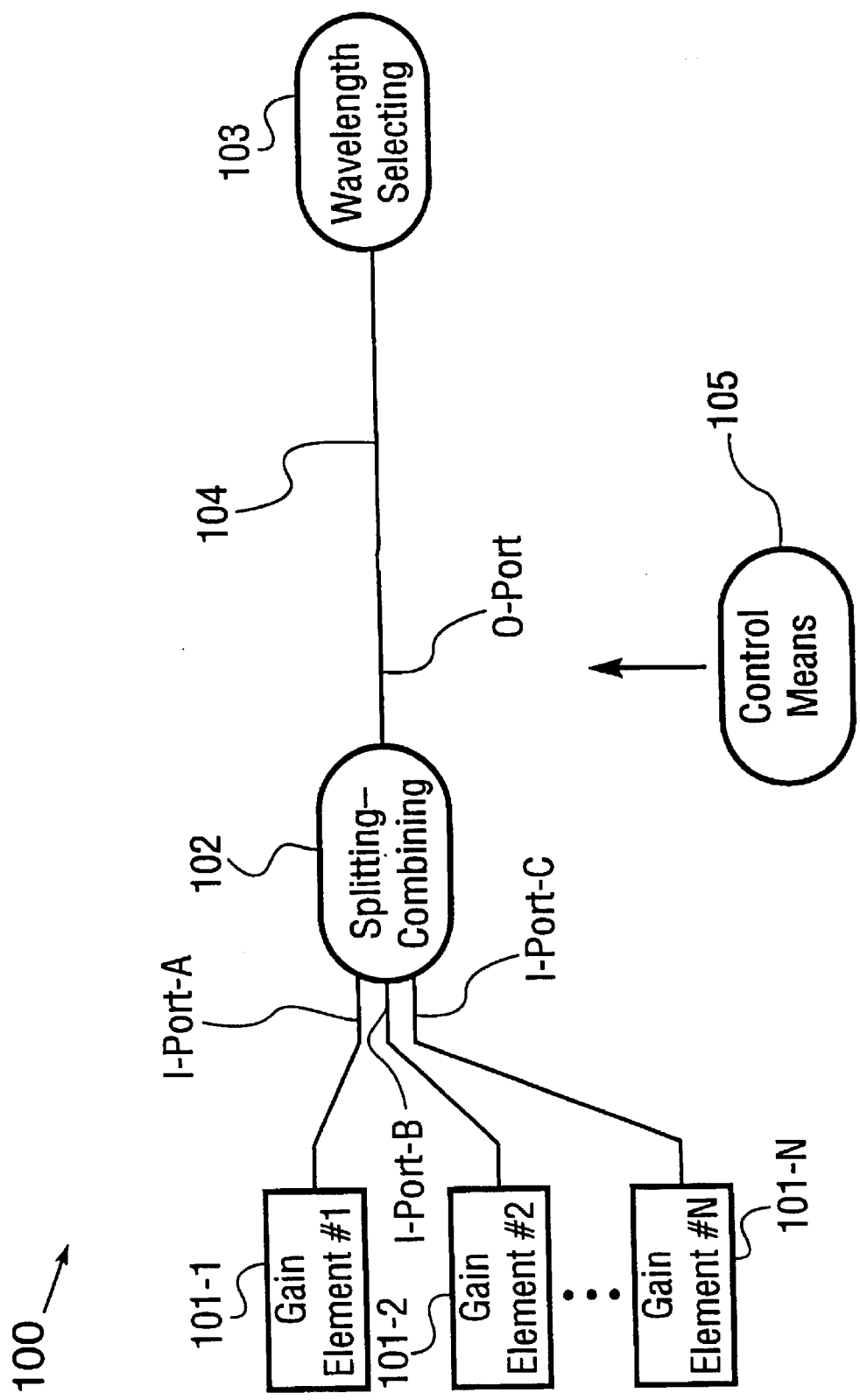
FIGS. 1A–1D illustrate two exemplary architectures of a tunable laser according to the present invention.

FIGS. 1A depicts an exemplary embodiment of a tunable laser according to the present invention. By way of example to illustrate the principal concept and the topological structure of a tunable laser architecture according to the present invention, tunable laser 100 comprises a plurality of gain elements 101-1 through 101-N having a plurality of gain spectra, a splitting-combining means 102; and a wavelength-selecting means 103. Gain elements 101-1 through 101-N are optically coupled to splitting-combining means 102 in parallel, and splitting-combining means 102 is in optical communication with wavelength-selecting means 103. There are at least two of the gain spectra that are distinct. It is generally preferable that the plurality of gain spectra are mutually distinct, so as to provide a wider tuning range.

In this specification and appending claims, two gain spectra are said to be "distinct", if there is at least one wavelength at which one of the two gain spectra displays practically significant (positive) gain while the other one does not. Two distinct gain spectra can be "partially overlapping" in wavelength: that is, there are one or more wavelengths at which both of the gain spectra display practically significant (positive) gain, as shown in FIG. 2A (note that both of the gain spectra display positive gain in the overlap region). Two distinct gain spectra can alternatively be "substantially non-overlapping": namely, there is no common wavelength at which both of the gain spectra display positive gain, as shown in FIG. 2B (note that the net gain would be negative if the two gain spectra were to overlap at all). Moreover, a plurality of gain spectra are said to be "mutually distinct", if each member of the gain spectra is "distinct" with respect to all other members of the gain spectra. This can be provided, for instance, by a plurality of gain spectra that are partially overlapping in a successive and incremental manner along wavelength, as illustrated in FIG. 2C. It can also be provided by a plurality of gain elements that are substantially non-overlapping in wavelength, thereby providing a plurality of discrete gain spectra, as illustrated in FIG. 2D. It can further be provided by a plurality of gain spectra in which some members of the gain spectra are partially overlapping in a successive manner, while others are substantially non-overlapping in wavelength, as shown in FIG. 2E. As such, the gain spectra can be selected such that a superposition of the gain spectra in wavelength has a predetermined pattern in the present invention.

In the embodiment of FIG. 1A, gain elements 101-1 through 101-N can be selected from the group of solid state gain media such as semiconductor diodes, doped fibers, doped crystals, doped glasses, and the like known in the art. Splitting-combining means 102 can be a fiber-optic coupler, a wavelength-division-multiplexing (WDM) coupler, a wavelength router, an active switching means, or a combination of these elements and/or other suitable elements known in the art. For instance, a combination of these elements can be used to provide an N×M splitting-combining means with N I-ports (N≧2) and M O-ports (M≧1), as described below. Wavelength-selecting means 103 can be provided by a diffraction grating, a prism, an acousto-optic filter, a tunable interference filter, a tunable birefrigent filter, a tunable etalon, or other wavelength-selecting elements known in the art.

In general, the splitting-combining means should be configured such that there are N (N≧2) I-ports and M (M≧1) O-ports. As a way of example, splitting-combining 102 of FIG. 1A is shown to have a plurality of I-ports including I-Port-A, I-Port-B, I-Port-C, and one O-Port. The I-ports are connected to N gain elements in a one-to-one correspondence. One of the O-ports is connected to the wavelength-selecting means, and any of the remaining (M−1) O-ports may be utilized to provide one or more output ports for the laser system. The splitting-combining means serves two functions: 1) at a given time, it routes/splits a back-coupled beam transmitted from the wavelength-selecting means along one or more paths and passes one or more sub-beams thus obtained into one or more gain elements; and 2) it combines the light amplified by one or more gain elements into a forward-coupled beam and directs the forward-coupled beam to the wavelength-selecting means. Furthermore, in the course of wavelength tuning, the splitting-combining means splits/routes the back-coupled beams along two or more paths into two or more gain elements. For instance, if an N×M fiber-coupler is used to provide a splitting-combining means, the back-coupled light beam is (nearly) uniformly split along N paths, and the N sub-beams thus created are directed to all N gain elements. In contrast, if a wavelength-dependent element, such as a wavelength router (to be described below), is used to serve as a splitting-combing means, a back-coupled beam with the selected wavelength may be routed only to a specific gain element which is capable of providing further amplification at the selected wavelength. Several examples of a splitting-combining means will be described in more detail in the following.

A tunable laser of the present invention may further comprise an axial-mode control means, for determining the axial-mode structure of the laser cavity. In the embodiment of FIG. 1A, an optical fiber 104 is used to provide an axial-mode control means as a way of example. Optical fiber 104 is interposed between, and in optical communication with, splitting-combining means 102 and wavelength-selecting means 103, thereby providing a substantial portion of an external cavity. The length of optical fiber 104 can be used to control the axial-mode structure of the laser cavity, for the spacing between two adjacent axial modes is given by $c/2L$, where c is the speed of light and L is the total optical length of the laser cavity. (For instance, L may range between 15 centimeters and 45 meters in the present invention.) The length of optical fiber 104 may be further varied by coupling a piezoelectric fiber stretcher to optical fiber 104, for instance.

Furthermore, there may be an alternative/additional axial-mode control means 105 implemented in tunable laser 100 of FIG. 1A. Alternative/additional axial-mode control means 105 can be provided by a dispersive means, comprising one or more elements selected from the group of prisms, diffraction gratings, high-dispersion fibers, dispersive materials including GaAs, Silicon, SF-11 and SF-59 glasses, and the like known in the art. The dispersive means can be implemented between splitting-combining means 102 and wavelength-selecting means. 103, for instance. Alternative/ additional axial-mode control means 105 can be further provided by an active-modulation means, including one or more elements selected from the group of pump-source-gain-modulation elements, piezoelectric modulators, electro-optic modulators, and acousto-optic modulators, and other modulation elements known in the art. As a way of example, in applications where semiconductor diodes are employed as the gain elements in a tunable laser of the present invention, one or more electronic power supplies can be utilized as an active-modulation means, to modulate the currents through the diodes, and thereby alter the optical length and consequently the axial-mode structure of the laser cavity.

As such, the principal operation of tunable laser 100 of FIG. 1A is as follows. As a way of example to illustrate the general principle of the present invention, gain elements 101-1 through 101-N are characterized by a plurality of gain spectra that are mutually distinct (e.g., the gain spectra are partially overlapping in a successive manner along wavelength as illustrated in FIG. 2C). One or more amplified beams transmitted from one or more of gain elements 101-1 through 101-N are passed into splitting-combining beams 102, where the beams are combined and further directed to wavelength-selecting means 103 by way of optical fiber 104. Wavelength-selecting means 103 transmits a diffracted beam with the selected wavelength back to splitting-combining means 102 via optical fiber 104. Splitting-combining means 102 in turn directs the back-coupled beam to one or more gain elements. Further amplification takes place in one or more gain elements whose gain spectra provide significant (positive) gain at the selected wavelength. Wavelength-selecting means 103 subsequently selects a different wavelength, which is further amplified by one or more different gain elements whose gain spectra show significant (positive) gain at the subsequent-selected wavelength. Hence, as the wavelength is tuned by action of the wavelength-selecting means, the constituent gain elements with distinct gain spectra take turns to amplify the successively selected wavelengths. As such, the availability of a plurality of gain elements and hence a plurality of distinct gain spectra greatly enhances the tuning range of the laser system of the present invention.

Moreover, by employing a long optical fiber, such as optical fiber 104, to provide a substantial portion of the external cavity in tunable laser 100 of the present invention, the resulting axial-mode spacing is so small that mode-hops become inconsequential for practical purposes. This not only renders the wavelength tuning to be effectively continuous, but also greatly simplifies the construction and thereby lowers the cost of the tunable laser of the present invention.

In tunable laser 100 of FIG. 1A, each of the first end-faces of gain elements 101-1 through 101-N, which is optically coupled to splitting-combining means 102, typically carries an anti-reflection (AR) coating, so as to minimize etalon effects. Moreover, each of the second end-faces of gain elements 101-1 through 101-N, which is on the opposing side of the corresponding first end-face for each gain element, may be covered with a high-reflective (HR) coating, so as to minimize the amount of light escaping from the gain elements.

Figure 1B:
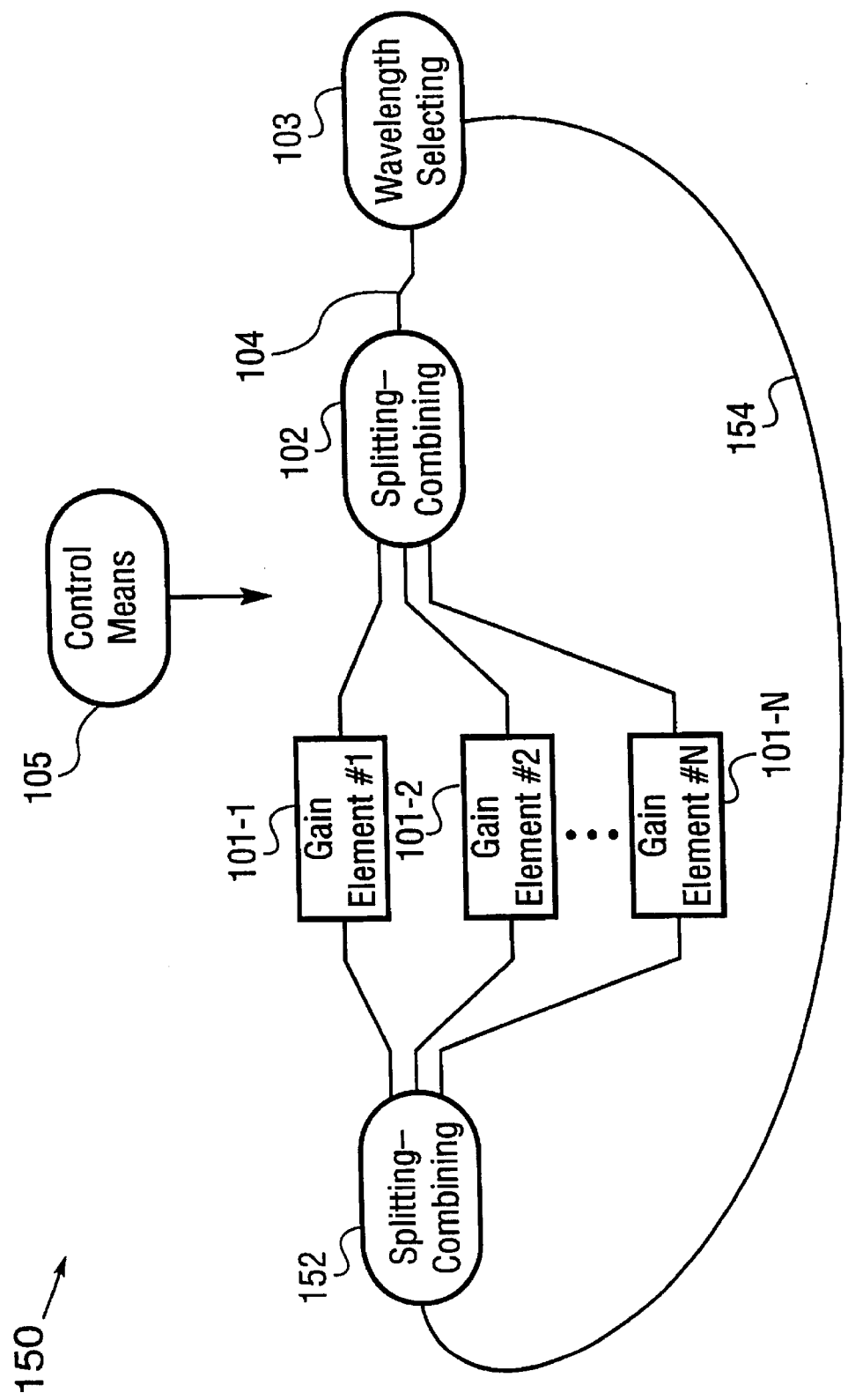
Figure 1C:
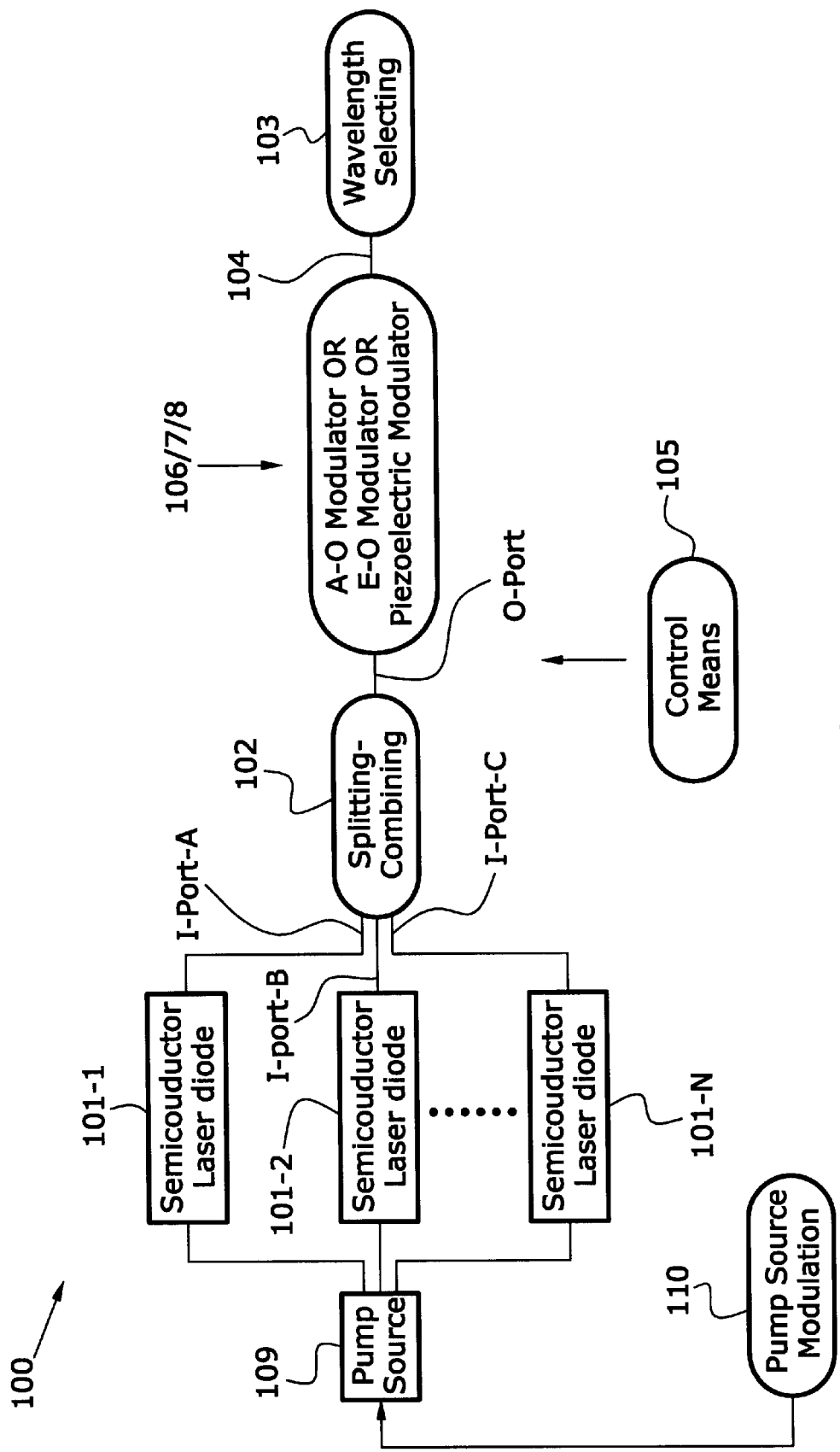
Figure 1D:
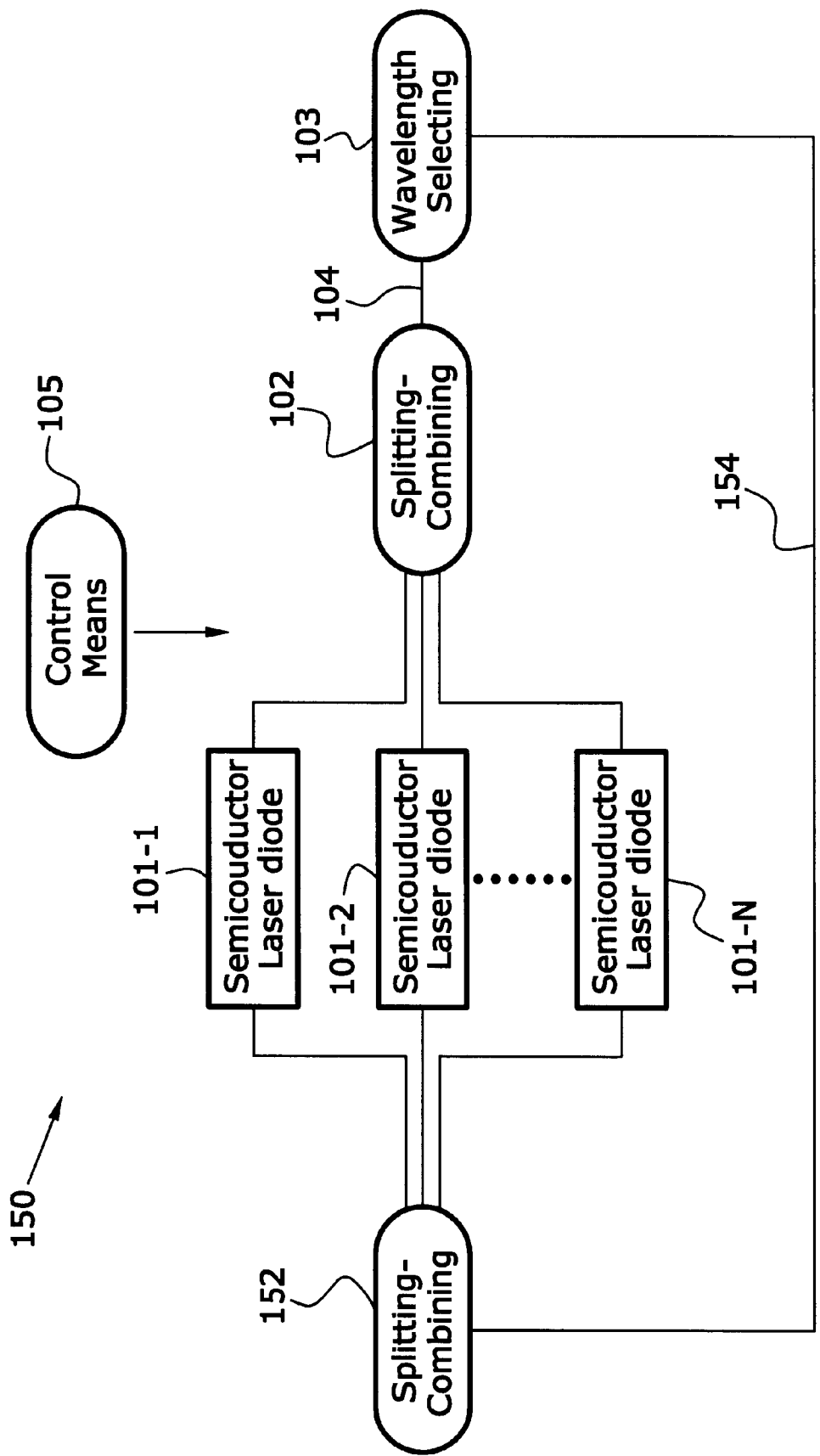

Rather than being covered with a high-reflective coating, each of the second end-faces of gain elements 101-1 through 101-N may be alternatively anti-reflection-coated and coupled to an auxiliary splitting-combining means 152, as depicted in FIG. 1B. Auxiliary splitting-combining means 152 is in turn optically coupled to wavelength-selecting means 103, by an auxiliary optical fiber 154 as a way of example. Auxiliary splitting-combining means 152 is functionally equivalent to splitting-combining means 102, as described above. And the operation principle of tunable laser 150 thus constructed is substantially similar to tunable laser 100 of FIG. 1A.

A major functional difference between the two tunable-laser architectures illustrated in FIGS. 1A and 1B is that tunable laser 100 of FIG. 1A supports standing waves, whereas tunable laser 150 of FIG. 1B acts as a ring laser that may be unidirectional (if an isolator is implemented), or bi-directional. There are comparable losses in both systems. However, light passes through each gain element twice per round-trip and hence acquires "twice gain" in the embodiment of FIG. 1A; whereas light may pass through each gain element only once per round-trip in the embodiment of FIG. 1B. As such, the architecture depicted in FIG. 1A is preferable, for the tunable laser thus constructed is simpler in construction and more efficient in performance. The following description and accompanying drawings provide several exemplary embodiments of a tunable laser utilizing the general architecture depicted in FIG. 1A.

Figure 3A:
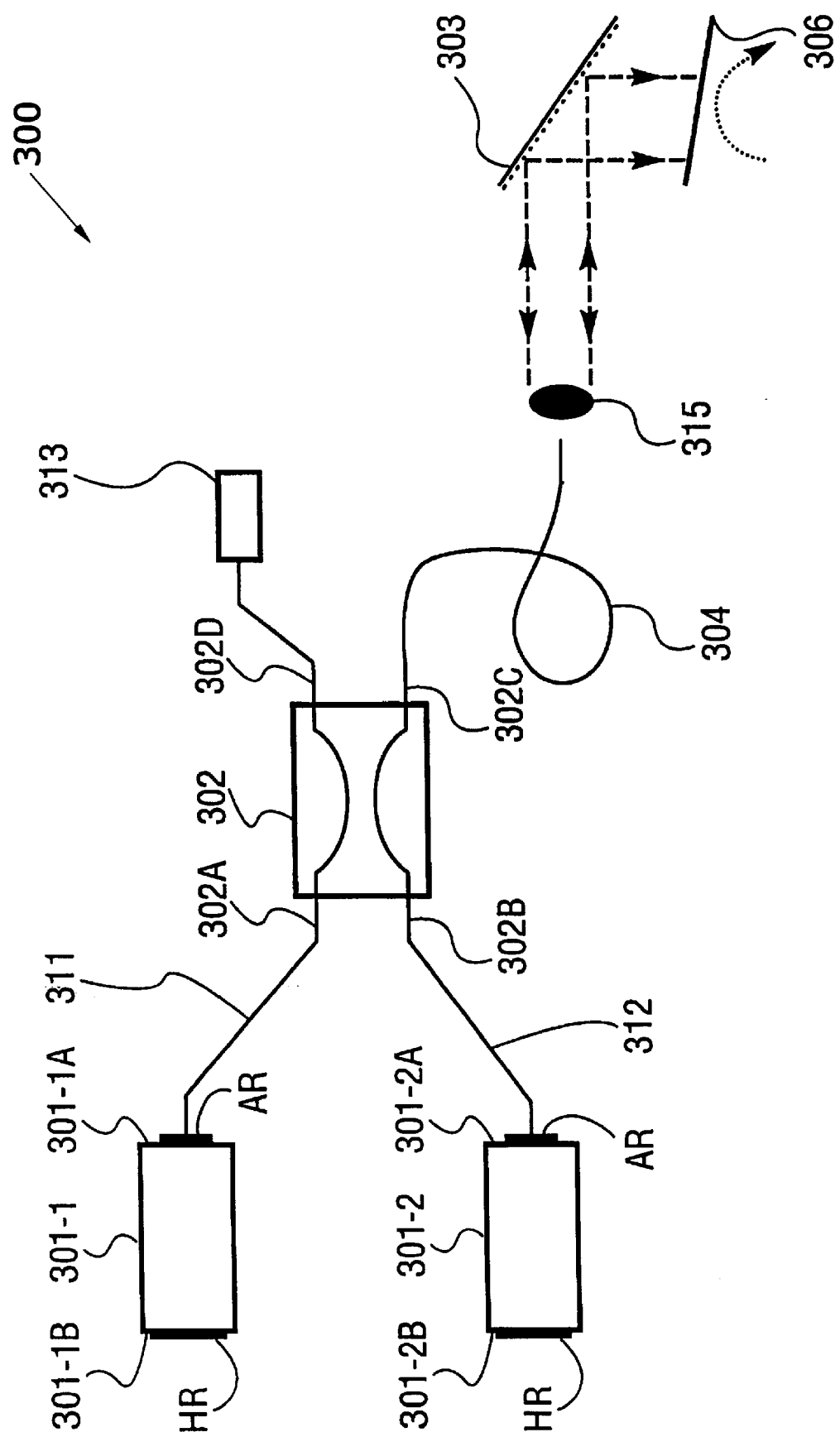
FIGS. 3A–3C depict two exemplary embodiments of a tunable laser employing two gain elements according to the present invention, and FIG. 3D displays spectral responses of exemplary fiber-optic coupler and WDM coupler.

FIG. 3A shows an exemplary embodiment of a tunable laser employing two gain elements, according to the present invention. Tunable laser 300 comprise first and second gain elements in the form of first and second semiconductor diodes 301-1, 301-2 having two distinct gain spectra, a splitting-combining means in the form of a fiber-optic coupler 302, a cavity-fiber 304, and a wavelength-selecting means in the form of a diffraction grating 303 and a movable mirror 306. First end-faces 301-1A, 301-2A of first and second semiconductor diodes 301-1, 301-2 each carry an anti-reflection coating AR. First I-port 302A of fiber-optic coupler 302 is optically coupled to first end-face 301-1A (via coating AR) of first semiconductor diode 301-1, for instance, by a first connecting-fiber 311. Similarly, second I-port 302B of fiber-optic coupler 302 is optically coupled to first end-face 301-2A (via coating AR) of second semiconductor diode 301-2 by a second connecting-fiber 312. Cavity-fiber 304 is optically coupled to first O-port 302C of fiber-optic coupler 302 on one side, and to diffraction grating 303 by way of an optical lens 315 on the other. Second O-port 302D of fiber-optic-coupler 302 leads to an output-port 313. Additionally, second end-faces 301-1B, 301-2B of first and second semiconductor diodes 301-1, 301-2 each are covered with a high-reflective coating HR.

In the embodiment of FIG. 3A, first and second diodes 301-1, 301-2 are characterized by two distinct gain spectra. (For example, first diode 301-1 may have a gain spectrum substantially covering a range of 1450–1530 nm in wavelength, whereas second diode 301-2 may have a gain spectrum substantially covering a range of 1520–1600 nm in wavelength.) Because the gain of a semiconductor laser diode is typically polarization dependent, fiber-optic coupler 302 is preferably a polarization maintaining (PM) coupler. Similarly, cavity-fiber 304, along with first and second connecting-fibers 311, 312, should be polarization maintaining (PM) optical fibers. As such, the laser cavity of tunable laser 300 extends from second end-face 301-1B of first diode 301-1 (or second end-face 301-2B of second diode 301-2) to movable mirror 306. The axial-mode structure of the laser cavity can be varied by many factors, for instance, by the length $L_{ext}$ of cavity-fiber 304. Typically, $L_{ext}$ should be selected such that the total optical length L of the laser cavity is sufficiently large and the resulting axial-mode spacing is sufficiently smaller than the tuning resolution required for a given application.

Figure 3B:
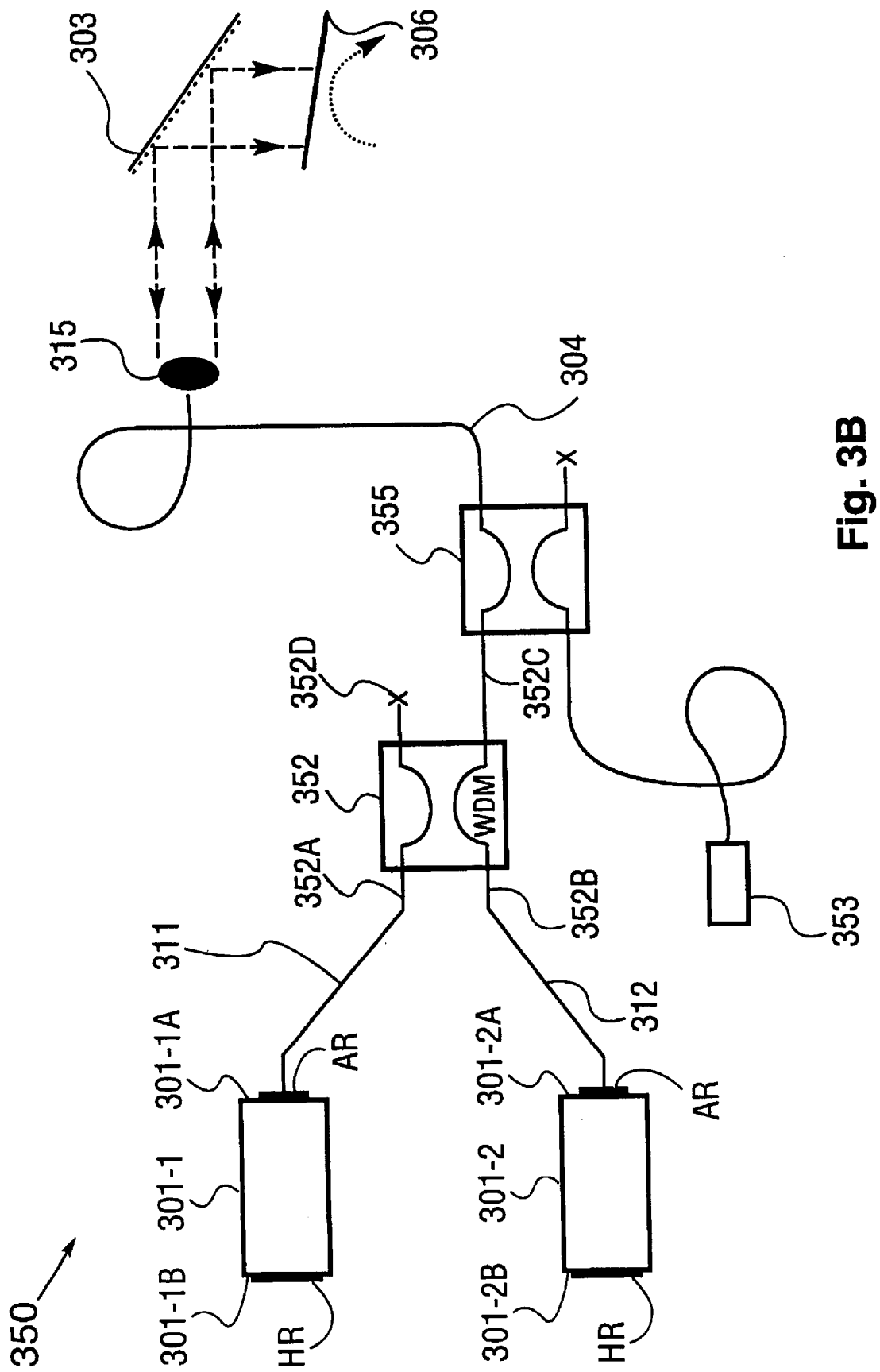
Figure 3C:
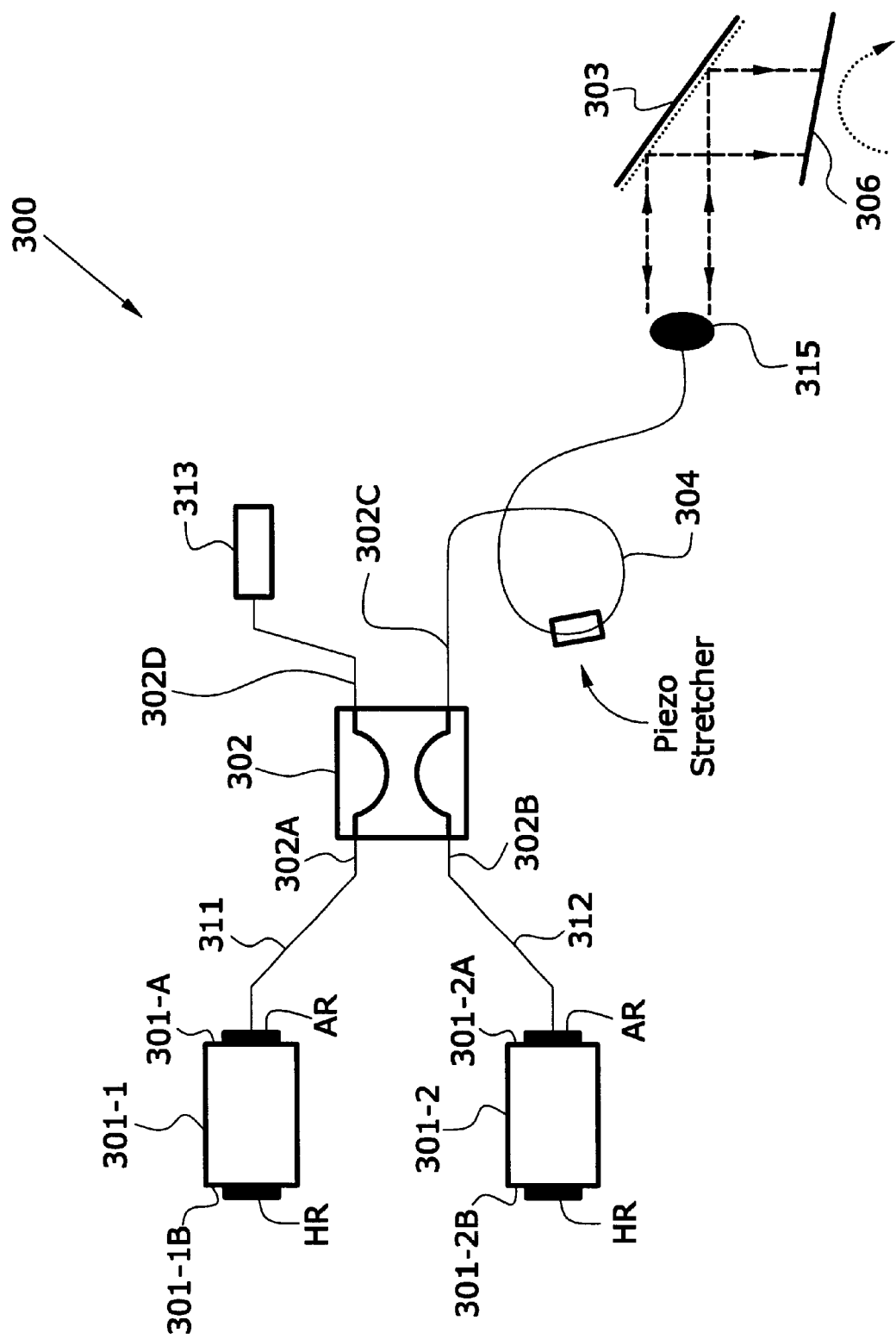
Figure 3D:
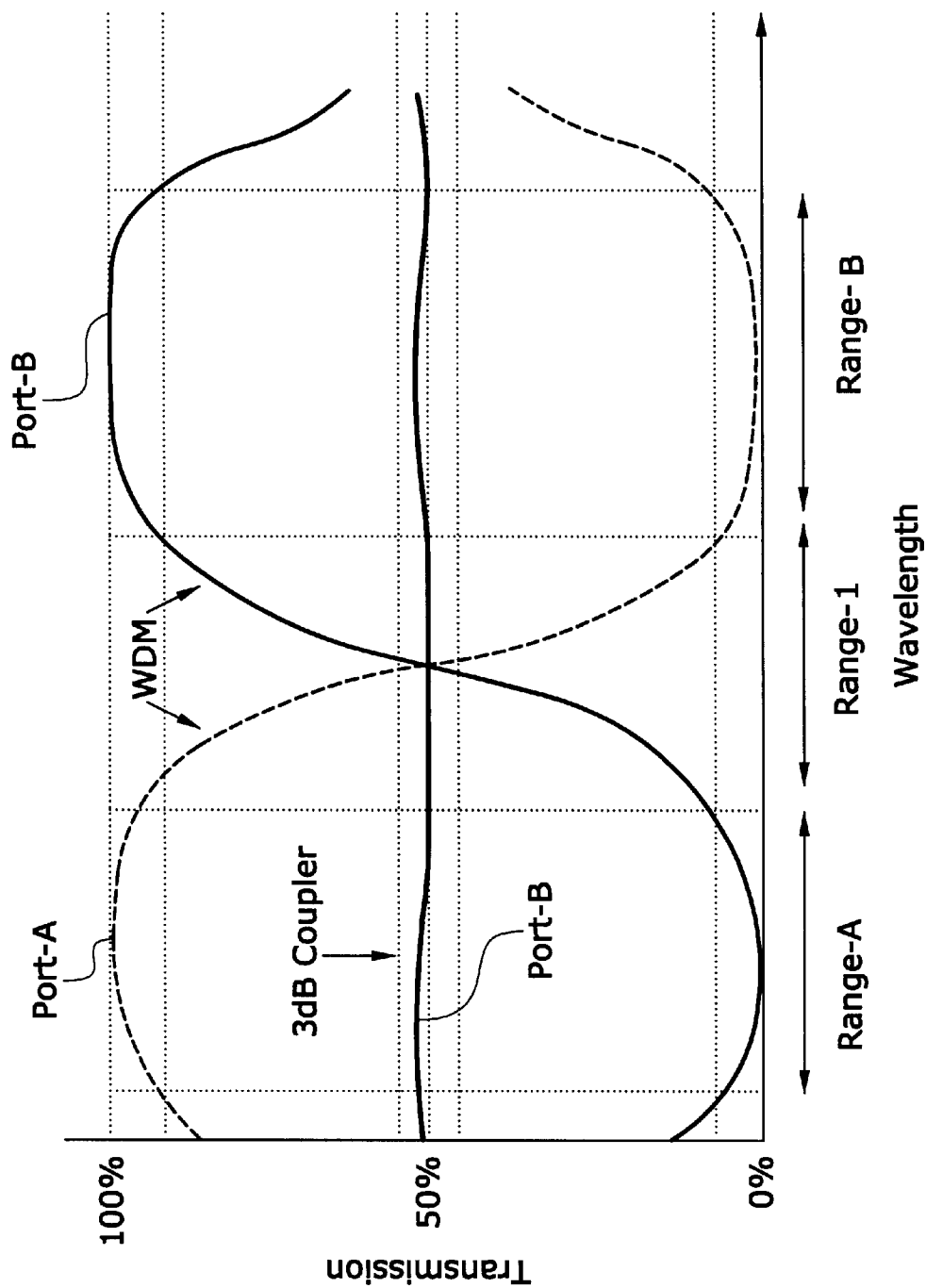

FIG. 3C displays the spectral responses of a 3 dB (i.e., 50%/50%) fiber-optic coupler and a WDM coupler. 3 dB-coupler curve depicts the transmission response of an exemplary I-port Port-B of a 3 dB (2×1 or 2×2) fiber-optic coupler as a function of wavelength (extending over a wavelength range of interest), as a way of example to illustrate the functional performance of a fiber-optic coupler as a splitting-combining means in the present invention. For a 3 dB fiber-optic coupler, a light beam passed into either of the two I-ports (e.g., either of first and second I-ports 302A, 302B of fiber-coupler coupler 302 in FIG. 3A) is split into two sub-beams, whereby the two sub-beams emerge from the two O-ports (e.g., first and second O-ports 302C, 302D of fiber-coupler coupler 302 in FIG. 3A) in an approximately nearly 50%/50% ratio. In the reverse direction, a light beam coupled into either of the O-ports is likewise split into two sub-beams, such that the two sub-beams emerging from the two I-ports also carry a nearly 50%/50% splitting ratio.

The transmission response of the 3 dB fiber-optic coupler shown in FIG. 3C is also characteristic of the transmission behavior of any of the I-ports of an N×M fiber-optic coupler having N I-ports and M O-ports. Generally, a light beam coupled into a designated O-port of an N×M fiber-optic coupler is uniformly divided into N sub-beams, which emerge from the N I-ports. Likewise, a light beam passed into any one of the N I-ports of the N×M fiber-optic coupler is also uniformly split, such that the designated O-port receives only 1/N of the incoming beam.

Referring back to FIG. 3A, tunable laser 300 operates as follows. A light beam transmitted from either of first and second diodes 301-1, 301-2 is passed into fiber-optic coupler 302, where nearly half of the beam is diverted to diffraction grating 303 by way of cavity-fiber 304. Movable mirror 306 along with diffraction grating 303 in turn selects a diffracted beam with the selected wavelength and transmits the selected beam back to fiber-optic coupler 302 via cavity-fiber 304. (Note: The dashed lines in FIG. 3A are shown for illustrative purpose. In practice, it is the diffracted beam that impinges onto movable mirror 306 perpendicularly gets to be selected and transmitted back to fiber-optic coupler 302 via the diffraction grating 303. And such is also the case in FIGS. 3B, 4A–4B, 5A, 5C, 6.) The back-coupled beam is then split into two sub-beams, which are further directed to first and second semiconductor diodes 301-1, 301-2 in a nearly 50%/50% ratio. If the gain spectra of first and second diodes 301-1, 301-2 are substantially non-overlapping, or partially overlapping however the overlapping region does not cover the selected wavelength, further amplification will take place in only one of the two diodes whose gain spectrum substantially covers the selected wavelength. Alternatively, if the gain spectra of diodes 301-1, 301-2 are partially overlapping and the selected wavelength falls into the overlapping region of the two gain spectra, further amplification can take place in both of the diodes. In the former scenario, each back-coupled beam suffers a 3 dB intrinsic loss in the course of operation of tunable laser 300, owing to the non-discriminating nature of fiber-optic coupler 302 in distributing the back-coupled beam to both of first and second diodes 301-1, 301-2. Each forward-coupled beam also incurs a 3 dB loss—however in the form of an output beam directed to output-port 313 upon passing through fiber-optic coupler 302. In the latter case, there is no intrinsic loss in a back-coupled beam. And there are two amplified beams (from the two diodes) directed to and combined by fiber-optic coupler 302, wherein half of the combined beam is diverted to output-port 313 in the form of an output beam. Hence, there is a net intrinsic loss of 3 dB in either case.

FIG. 3B depicts an alternative embodiment of a tunable laser employing two gain elements, according to the present invention. By way of example, tunable laser 350 is configured in a way similar to and hence shares a number of components used in the embodiment of FIG. 3A, as indicated by those labeled with identical numeral identifiers. In this case, a WDM coupler 352 is implemented to replace fiber-optic coupler 302 in FIG. 3A, wherein first and second I-ports 352A, 352B of WDM coupler 352 are optically coupled to first and second semiconductor diodes 301-1, 301-2 by first and second connecting-fibers 311, 312 respectively. A tap coupler 355 (e.g., a 25%/75% fiber-optic coupler) is optically coupled to a first O-port 352C of WDM coupler 352 on one side, and to cavity-fiber 304 on the other. Tap coupler 355 serves to divert a fraction of a back-coupled beam to an output-port 353, so as to provide an output beam for the laser system. Note that second O-port 352D of WDM coupler 352 is not in use.

Referring back to FIG. 3C now. The solid and dotted WDM curves display the respective transmission responses of two I-ports Port-A, Port-B of a WDM coupler as a function of wavelength. Unlike the situation with a 3 dB fiber-optic coupler, the overall transmission response of this exemplary WDM coupler can be classified into three categories. First, if an incoming beam coupled into a designated O-port (e.g., first O-port 352C of WDM coupler 352 in FIG. 3B) is within a first wavelength range as marked by Range-A, the transmission through Port-A (which can be first I-port 352A of WDM coupler 352 in FIG. 3B) is nearly 100%, and there is practically no transmission through Port-B (which can be second I-port 352B of WDM coupler 352 in FIG. 3B). Second, if the incoming beam coupled into the designated O-port falls within a second wavelength range as marked by Range-B, then the transmission through Port-B becomes nearly 100%, and there is practically has no transmission through Port-A. Third, if the incoming beam coupled into the designated O-port is within an intermediate wavelength range as marked by Range-I sandwiched between Range-A and Range-B, there can be finite transmission through both of Port-A and Port-B, and the specific splitting ratio between the two I-ports depends upon the wavelength, as illustrated in FIG. 3C. Moreover, the WDM coupler as shown is a reciprocal device for any light having a wavelength that falls within either wavelength Range-A or Range-B, in that light coupled into either of its two I-ports Port-A, Port-B is directed back to the originating O-port. In the case where light having a wavelength within wavelength Range-I is coupled into either of I-ports Port-A, Port-B, there will be finite transmission through its two O-ports (e.g., first and second O-ports 352C, 352D of WDM coupler 352 in FIG. 3B). Since the latter scenario occurs only for light having a wavelength within a specific range, such as wavelength Rang-I shown in FIG. 3C, second O-port 352D of WDM coupler 352 in FIG. 3B cannot be used to provide an output-port for all wavelengths of interest.

As such, each of the I-ports of a WDM coupler has a characteristic "wavelength-passing-range". By matching each I-port of a WDM coupler with an appropriate gain element whose gain spectrum substantially covers the wavelength-passing-range of the corresponding I-port, the resulting tunable laser has a lower coupling loss and is more efficient in operation. For instance, WDM coupler 352 in the embodiment of FIG. 3B can be configured such that first I-port 352A has a characteristic wavelength-passing-range (e.g., 1440–1520 nm) that is substantially covered by the gain spectrum of first diode 301-1, and second I-port 352B likewise has a characteristic wavelength-passing-range (e.g., 1500–1580 nm) that is substantially covered by the gain spectrum of second diode 301-2.

The overall operation of tunable laser 350 in FIG. 3B is similar to the embodiment of FIG. 3A, as described above. In this case, a back-coupled beam with the selected wavelength within either of the wavelength-passing-ranges of first and second I-ports 352A, 352B of WDM coupler 352 is passed into and further amplified by only one of the two diodes (i.e., first diode 301-1 or second diode 301-2). And an amplified beam is in turn directed back to first O-port 352C of WDM coupler 352, and further coupled to diffraction grating 303. For a back-coupled beam with the selected wavelength falling into an intermediate range between the wavelength-passing-ranges of first and second I-ports 352A, 352B of WDM coupler 352, the back-coupled beam is directed into both of first and-second diode 301-1, 301-2. Further amplification takes place in both of the diodes if the gain spectra of the two diodes are partially overlapping and the overlapping region covers the selected wavelength. Thus, there is no intrinsic loss as far as each back-coupled beam is concerned. Given that WDM coupler 352 is also a reciprocal device (that is, light follows the same path in both forward and backward directions), a forward-coupled beam generally incurs no intrinsic loss either, except when the operating wavelength is within the overlapping region of the two gain spectra and consequently half of the forward-coupled beam is split into second O-port 352D of WDM coupler 352. As such, second O-port 352D of WDM coupler 352 cannot be used for providing an output-port for most of the wavelengths of interest. Instead, output-port 353 as provided by tap coupler 355 serves as an output-port for all wavelengths, delivering a fraction of a back-coupled beam as an output beam. A notable advantage of such an output configuration is that ASE noise (originating from the diodes) is substantially filtered out in a back-coupled beam (since it has been diffracted twice). Also note that in the embodiment of FIG. 3A, a tap coupler can be additionally coupled to cavity-fiber 304 in an analogous-fashion, so as to divert a fraction of a back-coupled beam to an additional output-port thus created.

Either of tunable laser 300 of FIG. 3A and tunable laser 350 of FIG. 3B can be further configured as a multiple-output system, by coupling multiple tap couplers to cavity-fiber 304. Such systems would be desirable in applications where multiple output beams are simultaneously utilized for multiple tasks. In addition, an auxiliary output beam can be taken from the zeroth-order reflection off diffraction grating 303 (as in some of the conventional ECDLS).

Figure 4A:
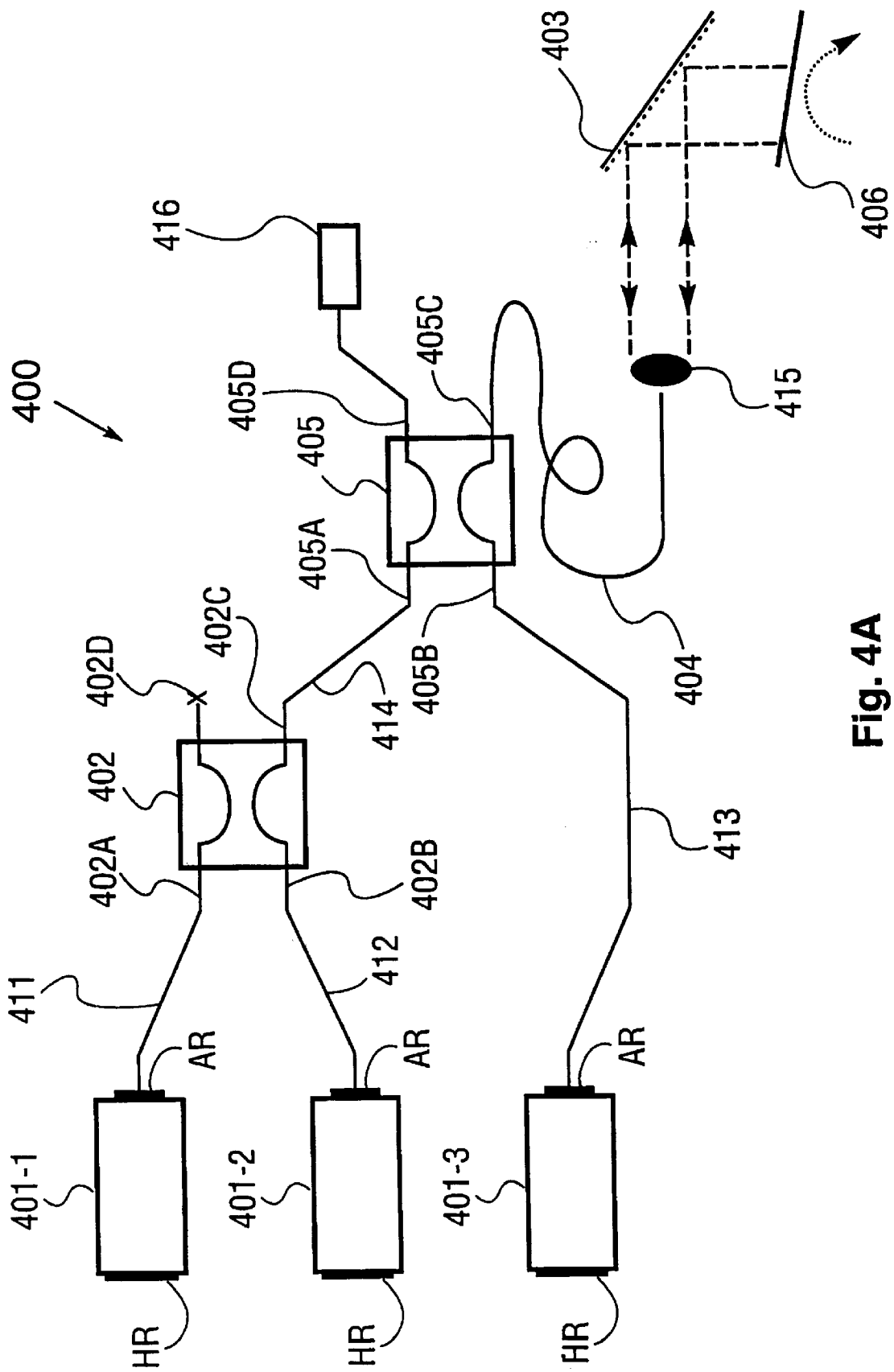
FIGS. 4A–4B show exemplary embodiments of a tunable laser employing three and four gain elements respectively, according to the present invention.

FIG. 4A shows an exemplary embodiment of a tunable laser employing three gain elements, according to the present invention. Tunable laser 400 comprises first, second and third gain elements in the form of first, second and third semiconductor diodes 401-1, 401-2, 401-3; a splitting-combining means in the form of first and second fiber-optic couplers 402, 405; a cavity-fiber 404; and a wavelength-selecting means in the form of a diffraction grating 403 and a movable mirror 406. As in the embodiment of FIG. 3A, first and second end-faces of each of the three semiconductor diodes carry anti-reflection coating and high-reflective coating as labeled by AR and HR respectively. First and second I-ports 402A, 402B of first fiber-optic coupler 402 along with second I-port-405B of second fiber-optic coupler 405 constitute three I-ports of the splitting-combining means in this system, and are connected to first, second and third semiconductor diodes 401-1, 401-2, 401-3 by first, second and third connecting-fibers 411, 412, 413 respectively. First I-port 405A of second fiber-optic coupler 405 is optically coupled to first O-port 402C of first fiber-optic coupler 402 by a fourth connecting-fiber 414. Cavity-fiber 404 is optically coupled to first O-port 405C of second fiber-optic coupler 405 on one side, and to diffraction grating 403 by way of an optical lens 415 on the other. Second O-port 405D of second fiber-optic coupler 405 provides an output port 416. (Note: second O-port 402D of first fiber-optic coupler 402 is not in use).

In the embodiment of FIG. 4A, first, second and third diodes 401-1, 401-2, 401-3 are preferably characterized by three gain spectra that are mutually distinct. For instance, the three gain-spectra may be partially overlapping in a successive fashion along wavelength, covering three adjacent wavelength ranges of 1450–1520 nm, 1510–1580 nm, and 1570–1640 nm. First and second fiber-optic couplers 402, 405 each are preferably a 3 dB PM fiber-optic coupler. Similarly, cavity-fiber 404, along with first, second, third and fourth connecting-fibers 411, 412, 413, 414, are preferably PM fibers. (They can also be single-mode fibers.) The length $L_{ext}$ of cavity-fiber 404 should be sufficiently long so that the axial-mode spacing is sufficiently small, thereby enabling the wavelength tuning to proceed in an effectively continuous manner for many applications.

In operation, a light beam transmitted from one of first, second and third diodes 401-1, 401-2, 401-3 is passed onto diffraction grating 403 via either first fiber-optic coupler 402 or third connecting-fiber 413, and subsequently via second fiber-optic coupler 405 followed by cavity-fiber 404. Movable mirror 406 along with diffraction grating 403 in turn selects a diffracted beam with the selected wavelength and transmits the selected beam back to first O-port 405C of second-fiber-optic coupler 405 via cavity-fiber 404. Second fiber-optic coupler 405 splits the back-coupled beam into two sub-beams in a nearly 50%/50% ratio, and directs the two sub-beams to first o-port 402C of first fiber-optic coupler 402 and to third semiconductor diode 401-3 via third connecting-fiber 413 respectively. First fiber-optic coupler 402 further splits the sub-beam passed into it along two paths, which lead to first and second diodes 401-1, 401-2. Subsequent amplification takes place in one of the three diodes if the selected wavelength does not fall into any of the overlapping regions in the three gain spectra. Otherwise, two of the three diodes may jointly provide further amplification. In terms of the coupling loss, a forward-coupled beam suffers a 3 dB loss, if it originates from either (or both) of first and second diodes 401-1, 401-2 and hence passes through first fiber-optic coupler 402. It will subsequently incur an additional 3 dB loss (in the form of an output beam diverted to output-port 416) upon passing through second fiber-optic couplers 405. If the forward-coupled beam alternatively originates from third diode 401-3, it incurs only a 3 dB loss in the form of an output beam diverted to output-port 416, upon passing through second fiber-optic couplers 405.

In the embodiment of FIG. 4A, first fiber-optic coupler 402 may be alternatively replaced a first WDM coupler, as characterized in FIG. 3C and utilized in FIG. 3B. The overall operation of the tunable laser thus constructed is analogous to tunable laser 400 of FIG. 4A, as described above. A notable difference would be that if the selected wavelength of a back-coupled beam is within either of the wavelength-passing-ranges of the two I-ports of the WDM coupler, the back-coupled is directed into only one of first and second diodes 401-1, 401-2, as in the case of FIG. 3B. Moreover, second fiber-optic coupler 405 may also be replaced a second WDM coupler, provided that care is taken to ensure that the wavelength-passing-ranges of the I-ports of the two WDM couplers match with the gain spectra of the three diodes.

Figure 4B:
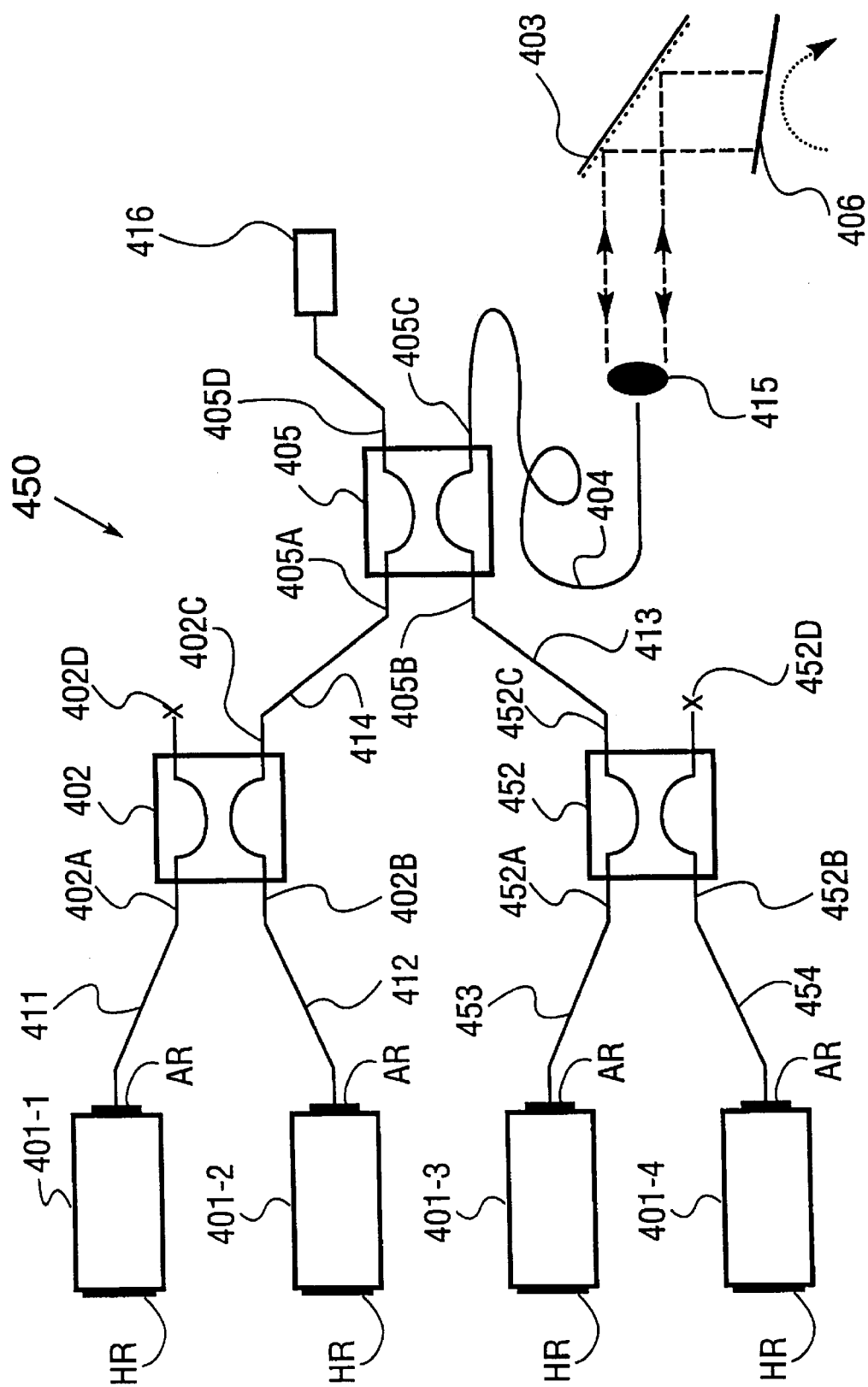

The configuration of the embodiment of FIG. 4A can be readily extended to a tunable laser system employing four (or more) gain elements. By way of example, FIG. 4B depicts an exemplary embodiment of a tunable laser employing four gain elements, built upon the embodiment of FIG. 4A. In addition to the components used in the embodiment of FIG. 4A, as indicated by those labeled with identical numeral identifiers, tunable laser 450 further comprises a fourth gain element in the form of a fourth semiconductor diode 401-4, and a third fiber-optic coupler 452. First and second I-ports 452A, 452B of third fiber-optic coupler 452 are coupled to third and fourth semiconductor diodes 401-3, 401-4 by way of fifth and sixth connecting-fibers 453, 454 respectively. First O-port 452C of third fiber-optic coupler 452 is optically coupled to second I-port 405B of second fiber-optic coupler 405 by third connecting-fiber 413. The remainder of tunable laser 450 is configured in 15, the same way, as tunable laser 400 of FIG. 4A. The general principle of operation of tunable laser 400 described above can also be applied to the operation to tunable laser 450 depicted in FIG. 4B. Furthermore, one or more WDM couplers can be alternatively implemented in FIG. 4B, to replace one or more fiber-optic couplers.

Those skilled in the art will appreciate that the general architecture of the embodiment of FIG. 4B can be readily extended to constructing a tunable laser system comprising N gain elements (N being any even integer greater than 4). The splitting-combining means in this case may be provided by N/2 WDM (or fiber-optic) couplers optically coupled to an (N/2)×M fiber-optic coupler (M being any integer greater than 1). As such, every two of the N gain elements are coupled to one of N/2 WDM couplers; and every two of N/2 WDM couplers are in turn optically coupled to one of N/2 I-ports of (N/2)×M fiber-optic coupler. Moreover, one of M O-ports of (N/2)×M fiber-optic coupler is optically coupled to a wavelength-selecting means (e.g., a diffraction grating such as diffraction grating 403 in FIG. 4B) by an optical fiber (such as cavity-fiber 404 in FIG. 4B). The remaining O-ports of (N/2)×M fiber-optic coupler provide up to (M−1) output-ports for the laser system. The overall operation of the tunable laser thus constructed is similar to the embodiment of FIG. 4B.

Figure 5A:
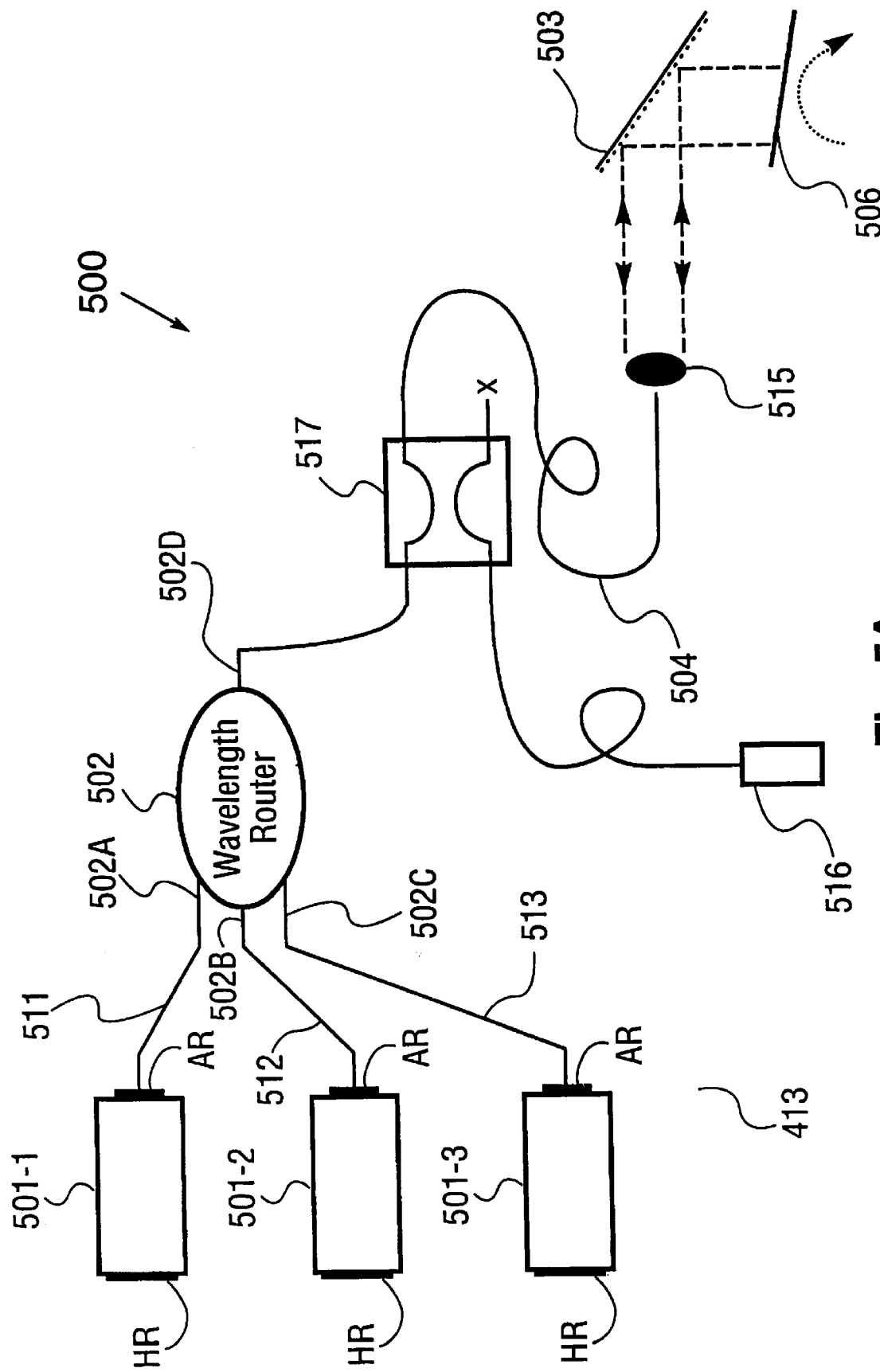
FIGS. 5A, 5C and 5D depict three exemplary embodiments of a tunable laser utilizing one or more wavelength routers according to the present invention, and FIG. 5B displays spectral response of an exemplary wavelength router.

FIG. 5A depicts an alternative embodiment of a tunable laser employing three gain elements and a wavelength router, according to the present invention. Tunable laser 500 comprises three gain elements in the form of first, second and third semiconductor diodes 501-1, 501-2, 501-3; a splitting-combining means in the form of a wavelength router 502; a tap coupler 517; a cavity-fiber 504; and a wavelength-selecting means in the form of a diffraction grating 503 and a movable mirror 506. As in the embodiment of FIG. 3A, first and second end-faces of each of the three semiconductor diodes carry an anti-reflection coating and a high-reflective coating as identified by AR and HR respectively. First, second and third I-ports 502-A, 502-B, 502-C of wavelength router 502 are optically coupled to first, second and third semiconductor diodes 501-1, 501-2, 501-3 by first, second and third connecting-fibers 511, 512, 513 respectively. An O-port 502D of wavelength router 502 is optically coupled to cavity-fiber 504 by way of tap coupler 517, wherein cavity-fiber 504 is further in optical communication with diffraction grating 503 by way of an optical lens 515. Tap coupler 517 (such as a 25%/75% fiber-optic coupler) in this case serves to route a fraction of a back-coupled beam to an output-port 516.

Figure 5B:
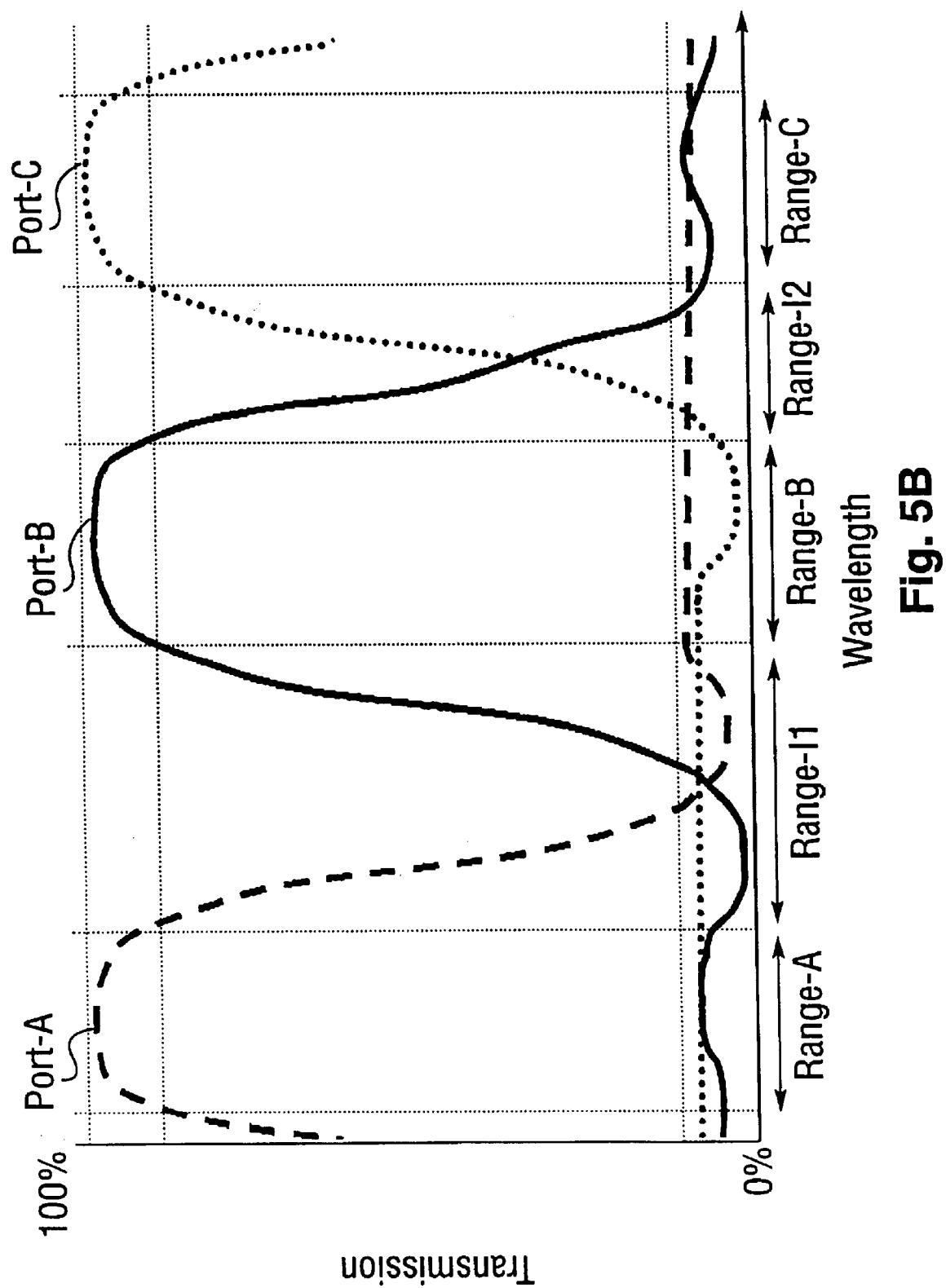

An N×1 wavelength router in this specification and appending claims refers to a device having N I-ports (N≧2) and a designated O-port, wherein a light beam within a specific wavelength range coupled into the designated O-port is routed only to a specific one of the I-ports and there is practically no transmission through all other I-ports. As a way of example to illustrate the functional performance of a wavelength router as a slitting-combining means in the present invention, the dashed, solid and dotted curves in FIG. 5B depict the transmission responses of three I-ports Port-A, Port-B, Port-C of a 3×1 wavelength router (e.g., I-ports 502A, 502B, 502C of wavelength router 502 in FIG. 5A) as a function of wavelength. As illustrated in the figure, if a light beam coupled into the designated O-port (e.g., O-port 502D of wavelength router 502 in FIG. 5A) is within a first wavelength range as marked by Range-A, Port-A has nearly 100% of transmission, whereas there is practically no transmission through either Port-B or Port-C. If a light beam coupled into the O-port falls within a second wavelength range as marked by Range-B, the transmission through Port-B is nearly 100%, and there is practically no transmission through either Port-A or Port-C. Moreover, if a light beam coupled into the O-port falls within a third wavelength range as marked by Range-C, the transmission through Port-C is nearly 100% and there is practically has no transmission through either Port-A or Port-B. As such, each I-port of a wavelength router provides a high transmission only for a characteristic "wavelength-passing-range", and no (or practically negligible) transmission for all other wavelength ranges. It should be pointed out that in contrast to a WDM coupler in which the transmission in an intermediate wavelength range sandwiched between two adjacent wavelength-passing-ranges of two I-ports is well defined and shared by the two I-ports (see FIG. 3C, for example), the transmission in an intermediate wavelength range sandwiched between any two adjacent wavelength-passing-ranges in a wavelength router, such as Range-I1 or Range-I2 in FIG. 5B, is undefined and hence generally avoided. (It is for this reason that the gain spectra of first, second and third diodes 501-1, 501-2, 501-3 in the embodiment of FIG. 5A are preferably selected to be substantially non-overlapping.) It should be further noted that the characteristic behavior of the exemplary wavelength router displayed in FIG. 5B is also applicable to describing the spectral response of any N×1 (N≧2) wavelength router.

Hence, by matching each I-port of a wavelength router with an appropriate gain element whose gain spectrum substantially covers the wavelength-passing-range of the corresponding I-port, there is only one gain element in action for providing further amplification for each selected wavelength (within one of the available wavelength-passing-ranges), as wavelength tuning takes place in a tunable laser thus configured. As a way of example, wavelength router 502 in the embodiment of FIG. 5A can be configured such that first I-port 502A has a characteristic wavelength-passing-range (e.g., 1400–1450 nm) that is substantially covered by the gain spectrum of first diode 501-1; second I-port 502B has a characteristic wavelength-passing-range (e.g., 1500–1550 nm) that is substantially covered by the gain spectrum of second diode 501-2; and third I-port 502C has a characteristic wavelength-passing-range (e.g., 1600–1650 nm) that is substantially covered by the gain spectrum of third diode 501-3. As such, a back-coupled beam with the selected wavelength lying within one of the wavelength-passing-ranges described above is routed only to one of the diodes whose gain spectrum covers the selected wavelength. (And there are certain wavelength ranges, such as (1450–1500 nm) and (1550–1600 nm), that are not made use of by the laser system, hence termed as "dead-zones".) Such a configuration not only reduces the coupling loss in power, but also avoids the cross-over noise (such as mode-beating) arising from two (or more) diodes that are simultaneously in action.

Figure 5C:
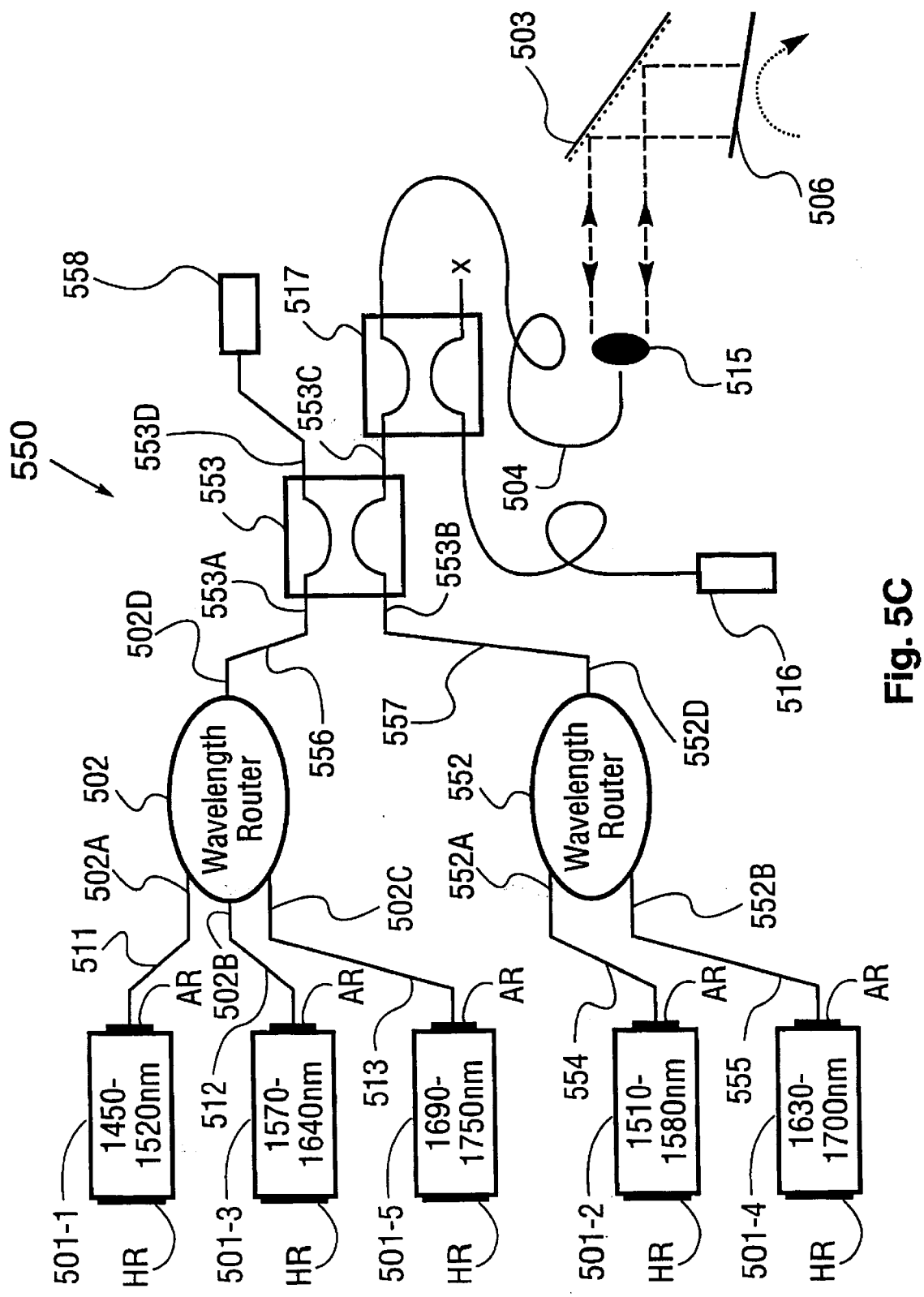
Figure 5D:
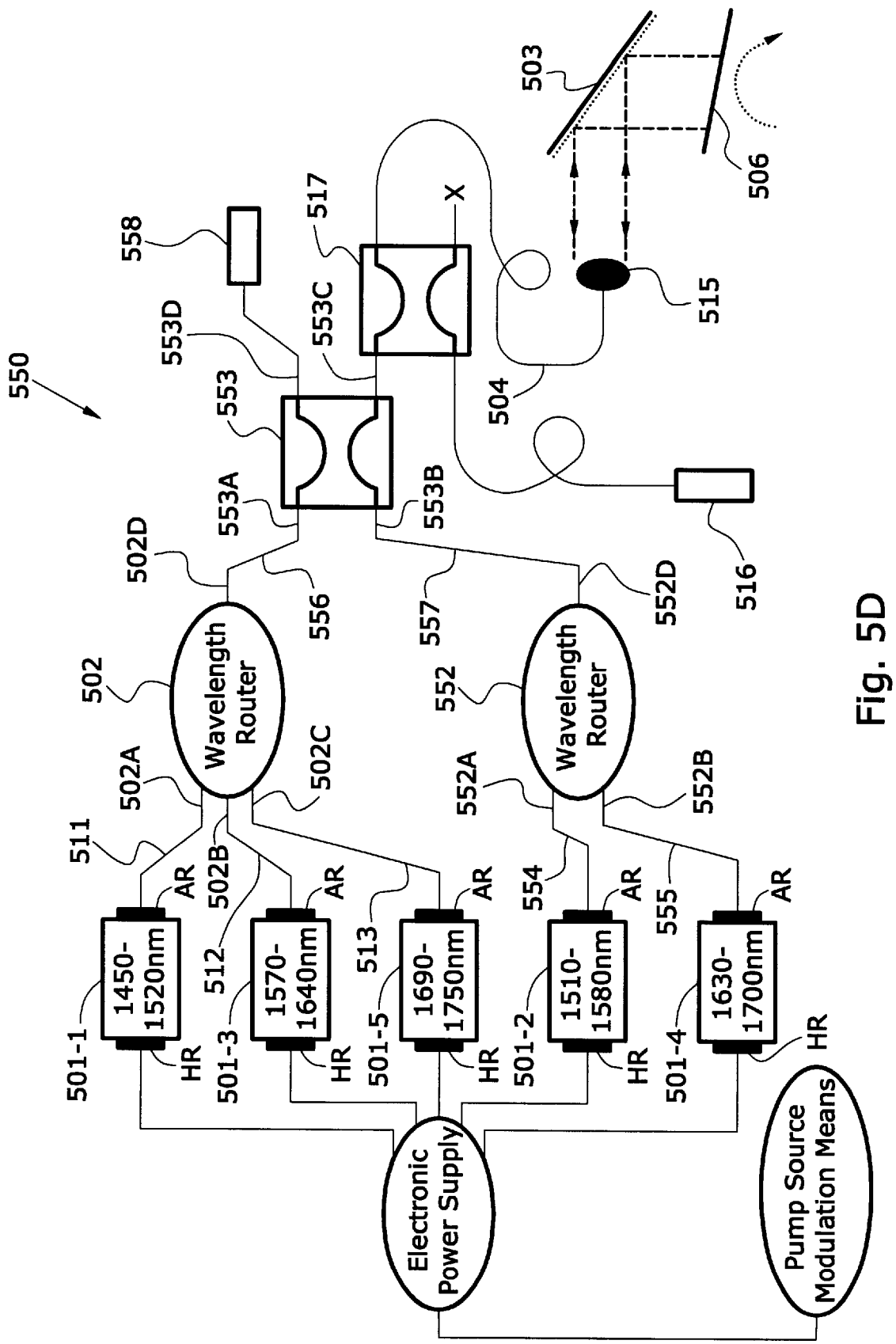

Moreover, by matching the I-ports of one or more wavelength routers to a plurality of gain elements according to a predetermined scheme, a tunable laser of the present invention can be configured to provide tunability in a variety of ways, as desired by practical applications. FIG. 5C depicts an exemplary embodiment of a tunable laser comprising five gain elements and two wavelength routers. Tunable laser 550 is built upon and hence share many of the components used in the embodiment of FIG. 5A, as indicated by those labeled with identical numeral identifiers. Tunable laser 550 comprise five gain elements in the form of five semiconductor diodes 501-1 through 501-5; a splitting-combining means in the form of first and second wavelength routers 502, 552 and a fiber-optic coupler 553; a tap coupler 517; a cavity-fiber 504; and a wavelength-selecting means in the form of a diffraction grating 503 and a movable mirror 506. As in the embodiment of FIG. 5A, first and second end-faces of each of the five semiconductor diodes carry an anti-reflection coating and a high-reflective coating as identified by AR and HR respectively. First, second and third I-ports 502-A, 502-B, 502-C of first wavelength router 502 are optically coupled to odd-numbered gain elements such as first, third and fifth semiconductor diodes 501-1, 501-3, 501-5 by first, second and third connecting-fibers 511, 512, 513 respectively. First and second I-ports 552-A, 552-B of second wavelength router 552 are in turn optically coupled to even-numbered gain elements such as second and fourth semiconductor diodes 501-2, 501-4 by fourth and fifth connecting-fibers 554, 555. O-ports 502-D, 552-D of first and second wavelength routers 502, 552 are optically coupled to first and second I-ports 553A, 553B of fiber-optic coupler 553 by sixth and seventh connecting-fibers 556, 557 respectively. First O-port 553C of fiber-optic coupler 553 is optically coupled to cavity-fiber 504 by way of tap coupler 517, wherein cavity-fiber 504 is further in optical communication with diffraction grating 503 by way of an optical lens 515. As in the embodiment of FIG. 5A, tap coupler 517 serves to route a fraction of a back-coupled beam to an output-port 516. Second O-port 553D of fiber-optic coupler 553 provides an auxiliary output-port 558 in this case.

In the above embodiment, the characteristic spectral response and the functional performance of second wavelength router 552 are substantially similar to first wavelength router 502, as illustrated in FIG. 5B and described in FIG. 5A. In operation, fiber-optic coupler 553 (e.g., a 3 dB coupler) splits a back-coupled beam with the selected wavelength into two sub-beams and direct them to first and second wavelength routers 502, 552 by way of their respective O-ports 502-D, 552-D. Depending upon the selected wavelength, one of the sub-beams is routed by either of first and second wavelength routers 502, 552 to one of the diodes whose gain spectrum substantially covers the selected wavelength. An amplified beam is then routed back to fiber-optic coupler 553, where nearly half of the beam is directed to auxiliary output-port 558, and the remainder of the beam is transmitted to diffraction grating 503 via tap coupler 517 and cavity-fiber 504. Thus, as wavelength tuning takes place, diodes 501-1 through 501-5 take turns to amplify successive back-coupled beams with the selected wavelengths according to their respective gain spectra, thereby providing a wide range of output wavelengths.

By way of example to illustrate the versatility of a tunable laser of the present invention, the gain spectra of five diodes 501-1 through 501-5 are selected to be partially overlapping in wavelength, covering the exemplary wavelength ranges indicated in FIG. 5C. However, the diodes are grouped in such a way that odd-numbered diodes 501-1, 501-3, 501-5 connected to first wavelength router 502 provide the gain spectra that are substantially non-overlapping in wavelength (which can be identified as the gain spectra labeled by O in FIG. 2C); and even-numbered diodes 501-2, 501-4 connected to second wavelength router 552 likewise provide the gain spectra that are substantially non-overlapping as well (which can be identified as the gain spectra labeled by E in FIG. 2C). Moreover, each of the gain spectra provided by even-numbered diodes 501-2, 501-4 is sandwiched between (and partially overlapping with respect to) two of the gain spectra provided by odd-numbered diodes 501-1, 501-3, 501-5 in wavelength, and vice versa. Wavelength tuning in this system may be operated in the normal way, as described above. It may alternatively be carried out as follows: 1) first turning off the even-numbered diodes while keeping the odd-numbered diodes on, and tuning through the entire wavelength range available; then 2) turning on the even-numbered diodes while keeping the odd-numbered diodes off, and tuning through the entire wavelength range again. Such a procedure of wavelength tuning not only yields the output wavelengths covering the entire tunable range, as would be in the case where all five diodes are kept on in the course of wavelength tuning, it provides additional advantages. For instance, since the available gain spectra at a given time are substantially non-overlapping (as provided by the odd-numbered or even-numbered diodes), only one of the diodes is providing amplification at any time during tuning, thereby avoiding the cross-over effects (e.g., low-frequency beat-note products) brought about by two (or more) diodes that are simultaneously in action.

The aforementioned method serves to provide an exemplary illustration of the versatility of tunable laser 550 of FIG. 5C in selecting/tuning wavelength. Those skilled in the art will recognize that there are many alternative ways of selecting gain spectra and matching the wavelength routers with the selected gain elements according to predetermined schemes as desired in practical applications. A skilled artisan will know how to design a tunable laser in accordance with the present invention, to best suit a given application.

Those skilled in the art will further appreciate that the architecture of the embodiment of FIG. 5C can be readily extended to constructing a tunable laser comprising N gain elements (e.g., N>5) and a splitting-combining means in the form of a combination of wavelength routers and fiber-optic couplers. As exemplified in FIG. 5C, the gain elements can be divided into groups according to their gain spectra, wherein each group is assigned to a "matching" wavelength router. And the wavelength routers are in turn connected to one or more fiber-optic couplers that lead to a wavelength-selecting means (via an optical fiber, for instance). Wavelength tuning in such a system can be carried out while alternately turning on/off a selected number of groups of the gain elements according to a predetermined scheme, thereby providing various collections of output wavelengths as desired in practical applications and further ensuring a more stable performance of the laser system by mitigating the noise generated in the gain elements.

Figure 6:
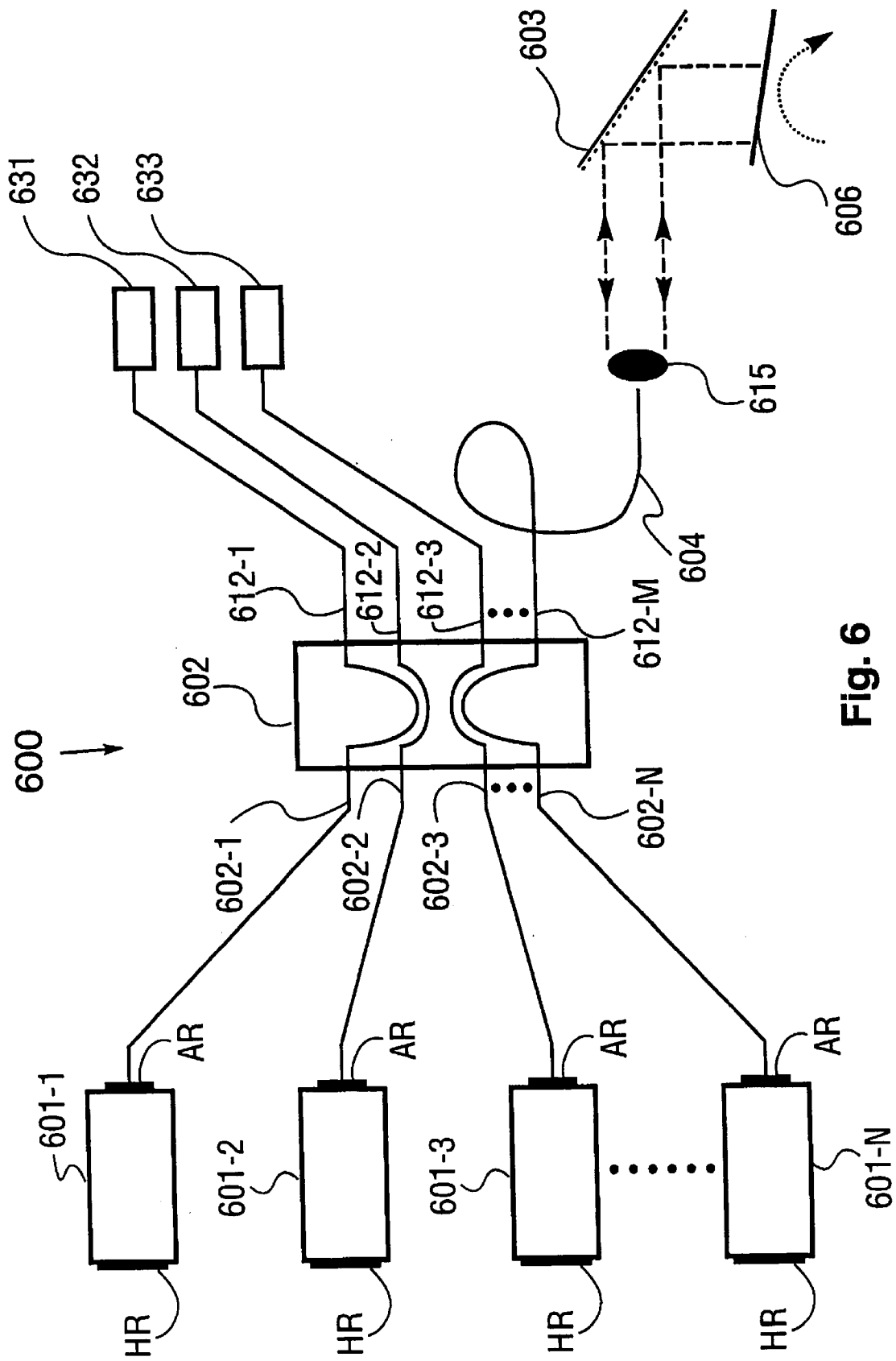
FIG. 6 shows an exemplary embodiment of a tunable laser employing N gain elements (N being any integer greater than 2), according to the present invention.

FIG. 6 depicts an embodiment of a tunable laser employing N gain elements (where N can be any integer greater than 2), according to the present invention. Tunable laser 600 comprise N gain elements in the form of N semiconductor diodes 601-1 through 601-N; a splitting-combining means in the form of an N×M fiber-optic coupler 602 (where M is any integer greater than 1); a cavity-fiber 604; and a wavelength-selecting means in the form of a diffraction grating 603 and a movable mirror 606. As in the embodiment of FIG. 3A, first and second end-faces of each of the semiconductor diodes carry an anti-reflection coating and a high-reflective coating as identified by AR and HR respectively. N I-ports 602-1 through 602-N of N×M fiber-optic coupler 602 are optically coupled to diodes 601-1 through 601-N in a one-to-one correspondence. One of M O-ports 612-1 through 612-H of N×M fiber-optic coupler 602, such as O-port 612-M by way of example, is optically coupled to cavity-fiber 604, which is in turn optically coupled to diffraction grating 603 by way of an optical lens 615. The remaining O-ports of N×M fiber-optic coupler 602 provide up to (M−1) output-ports, such as output-ports 631, 632, 633, etc.

In the embodiment of FIG. 6, N diodes 601-1 through 601-N are preferably characterized by N gain spectra that are mutually distinct. As way of example, the N gain-spectra may be partially overlapping in a successive manner along wavelength, altogether covering an extended wavelength range. The overall operation of this system is as follows. A forward-coupled beam originating from one (or two) of N diodes is transmitted to diffraction grating 603 by way of fiber-optic coupler 602 followed by cavity-fiber 604. Movable mirror 606 along with diffraction grating 603 in turn selects a diffracted beam with the selected wavelength and transmits the beam back to fiber-optic coupler 602 via cavity-fiber 604. Fiber-optic coupler 602 splits the back-coupled beam into N sub-beams and diverts the sub-beams to N diodes 601-1 through 601-N in a one-to-one correspondence. Subsequent amplification takes place in one of the N diodes, if the selected wavelength does not fall into any of the overlapping regions in the N gain spectra. Otherwise, two of N diodes may jointly provide further amplification. Additionally, as in the embodiment of FIG. 3B, one or more tap couplers (not shown) may be coupled to cavity-fiber 604, so as to divert a fraction of a back-coupled beam to one or more additional output-ports.

As exemplified in the above embodiments, the availability of a plurality of gain elements and hence a plurality of distinct gain spectra not only greatly enhances the tuning range, it can be further exploited to provide additional avenues in wavelength selecting/tuning in a tunable laser of the present invention. For example, by utilizing a plurality of gain spectra that are partially overlapping in a successive manner along wavelength, the tunable laser of the present invention provides a continuous-tuning laser source with a tuning range that is effectively all-wavelength available. Alternatively, by using a plurality of gain spectra that are substantially non-overlapping in wavelength, the tunable laser of the present invention effectively acts as a wavelength-selectable laser source, which is capable of providing a wide selection of output wavelengths. Moreover, the gain elements can be divided into groups according to their gain spectra, and different groups are then alternately turned on/off in the course of wavelength tuning. This way of operation ensures that only one gain element is providing further amplification for each selected wavelength at a given time during operation, thereby preventing the cross-over effects that tend to arise when two gain elements are simultaneously in action. It may be further used to provide alternate collections of output wavelengths. All in all, the availability of a plurality of gain elements and hence a plurality of distinct gain spectra renders versatile tenability and greater utility to a tunable laser of the present invention.

The exemplary embodiments described above provide only several of many embodiments of a tunable laser according to the present invention. Moreover, the topological structure and the operation principle of the exemplary embodiments illustrated in FIGS. 3–6 can be applied to design tunable lasers using the architecture illustrated in FIG. 1B. Those skilled in the art will recognize that a variety of tunable laser systems can be constructed according to the principle of the present invention, and various means and methods can be devised to perform the designated functions in an efficient/equivalent manner. Moreover, various changes, substitutions, and alternations can be made herein without departing from the principle and the scope of the invention.

As such, the tunable laser of the present invention provides many advantages over the prior art tunable laser systems, summarized as follows:

By advantageously employing a plurality of gain elements with a plurality of distinct gain spectra, the tunable laser of the present invention provides a continuous-tuning laser source with a tuning range that is effectively all-wavelength available. By way of example, a tuning range of at least 200 nm can be readily achieved in a tunable laser of the present invention.

By utilizing a long optical fiber as a substantial portion of an external cavity, the axial-mode spacing becomes so small that mode-hops can be effectively ignored in a tunable laser of the present invention. This eliminates the need for an elaborate construction with stringent mechanical tolerances that are prevalent in the prior art ECDLS, thereby rendering the tunable laser of the present invention a simpler and lower cost construction. Moreover, the use of an optical fiber as a substantial portion of the external cavity enables the tunable laser of the present invention to be more flexible and rugged in structure.

By advantageously exploiting the availability of a plurality of distinct gain spectra in various ways, a tunable laser of the present invention can be configured as a continuous-tuning laser source, a wavelength-selectable laser source, or a switchable laser source providing various collections of desirable wavelengths.

All in all, the present invention provides a versatile and robust tunable laser source in a simple and low cost construction.

Although the present invention and its advantages have been described in detail, it should be understood that various changes, substitutions, and alterations can be made herein without departing from the principle and the scope of the invention. Accordingly, the scope of the present invention should be determined by the following claims and their legal equivalents.

What is claimed is:

1. A tunable laser comprising:
   a. a plurality of gain elements having a plurality of gain spectra, wherein at least two of said gain spectra are distinct;
   b. a wavelength-selecting means for selecting a distinct wavelength;
   c. a splitting-combining means on one side in separate optical communication with each of said gain elements and on the other side in optical communication with said wavelength-selecting means such that a first beam propagating away of any of said gain elements is directed towards said wavelength selecting means and such that a second beam received from said wavelength selecting means with said distinct wavelength is directed to a corresponding gain element of said plurality of gain elements, said corresponding gain element having a gain spectrum at least partially overlapping said distinct wavelength;

d. at least one mode hops reducing means providing optical communication between said wavelength-selecting means and said splitting-combining means for providing an axial-mode spacing such that at least one of said first beam and said second beam has mode hops sufficiently smaller than a required tuning resolution, said reducing means selected from a group consisting of an axial-mode control means and an axial-mode structure; and wherein said reducing means is operated in correspondence with said wavelength-selecting means such that a tuning range is spanning up to said at least two distinct gain spectra.

2. The tunable laser of claim 1 wherein said mode hops reducing means consisting of said axial-mode control means and said axial-mode structure and wherein said axial-mode control means controls said axial-mode structure.

3. The tunable laser of claim 2 wherein said axial-mode structure is substantially determined by an optical length of said laser cavity.

4. The tunable laser of claim 3 wherein said optical length of said laser cavity ranges between 15 centimeters and 45 meters.

5. The tunable laser of claim 2 wherein said axial-mode control means is provided by an optical fiber, in optical communication with said splitting-combining means and said wavelength-selecting means.

6. The tunable laser of claim 5 wherein said optical fiber comprises an element selected from the group consisting of single-mode fibers and polarization maintaining fibers.

7. The tunable laser of claim 5 further comprising a piezoelectric fiber stretcher coupled to said optical fiber, whereby a length of said optical fiber is varied by activating said piezoelectric fiber stretcher.

8. The tunable laser of claim 2 wherein said axial-mode control means is provided by a dispersive means.

9. The tunable laser of claim 8 wherein said dispersive means comprises one or more elements selected from the group consisting of prisms, diffraction gratings, high-dispersion fibers, and dispersive materials including GaAs, Silicon, SF-11 and SF-59 glasses.

10. The tunable laser of claim 2 wherein said axial-mode control means is provided by an active-modulation means.

11. The tunable laser of claim 10 wherein said active-modulation means comprises an element selected from the group consisting of pump-source-modulation elements, piezoelectric modulators, electro-optic modulators, and acousto-optic modulators.

12. The tunable laser of claim 11 wherein said gain elements comprise a plurality of semiconductor diodes, and wherein said active-modulation means comprises one or more electronic power supplies, for modulating one or more currents through one or more of said semiconductor diodes.

13. The tunable laser of claim 1 wherein said wavelength-selecting means comprises an element selected from the group consisting of diffraction gratings, prisms, tunable acousto-optic filters, tunable interference filters, tunable birefrigent filters, and tunable etalons.

14. The tunable laser of claim 13 wherein said wavelength-selecting means comprises a diffraction grating in optical communication a movable mirror, and wherein said movable mirror is positioned to reflect a diffracted beam with a selected wavelength back to said splitting-combining means.

15. The tunable laser of claim 13 wherein said wavelength-selecting means comprises a movable diffraction grating, and wherein said movable diffraction grating is positioned to transmit a diffracted beam with a selected wavelength back to said splitting-combining it means.

16. The tunable laser of claim 1 wherein each of said gain elements is selected from the group consisting of solid state gain media, semiconductor diodes, doped fibers, doped crystals, and doped glasses.

17. The tunable laser of claim 16 wherein each of said gain elements comprises a semiconductor diode, having first and second end-faces, wherein said first end-face is in optical communication with said splitting-combining means, and wherein said first and second end-faces carry anti-reflection (AR) and high-reflective (HR) coatings respectively.

18. The tunable laser of claim 16 wherein each of said gain elements comprises a semiconductor diode, having first and second end-faces, wherein said first end-face is in optical communication with said splitting-combining means and carries an anti-reflection (AR) coating.

19. The tunable laser of claim 1 wherein said at least two of said gain spectra are partially overlapping in wavelength.

20. The tunable laser of claim 19 wherein said gain spectra are partially overlapping in a successive manner along wavelength.

21. The tunable laser of claim 1 wherein said at least two of said gain spectra are substantially non-overlapping in wavelength.

22. The tunable laser of claim 21 wherein said gain spectra are substantially non-overlapping in wavelength.

23. The tunable laser of claim 1 wherein splitting-combining means comprises one or more elements selected from the group consisting of fiber-optic couplers, WDM couplers, wavelength routers, and active-switching elements.

24. The tunable laser of claim 23 wherein said splitting-combining means comprises an N×M fiber-optic coupler having N I-ports and M O-ports, and wherein N is any integer greater than or equal to 2 and M is any integer greater than or equal to 1.

25. The tunable laser of claim 24 wherein a particular one of said M O-ports is optically coupled to said wavelength-selecting means by an optical fiber, and wherein one or more of said M O-ports provide one or more output-ports.

26. The tunable laser of claim 25 further comprising an auxiliary fiber-optic coupler, in optical communication with said particular one of said M O-ports and said optical fiber, whereby a fraction of a back-coupled beam is diverted to an auxiliary output-port.

27. The tunable laser of claim 24 wherein said gain elements comprise N semiconductor diodes, optically coupled to said N I-ports in a one-to-one correspondence.

28. The tunable laser of claim 23 wherein said splitting-combining means comprises a first wavelength router having N1 I-ports (N1≧2) and a first O-port, a second wavelength router having N2 I-ports (N1≧2) and a second O-port, and a fiber-optic coupler having first and second I-ports and third and fourth O-ports.

29. The tunable laser of claim 28 wherein said N1 I-ports and said N2 I-ports of said first and second wavelength routers are optically coupled to N semiconductor diodes (N=N1+N2) in a one-to-one correspondence, wherein said first and second O-ports of said first and second wavelength routers are optically coupled to first and second I-ports of said fiber-optic coupler respectively, wherein said third O-port of said fiber-optic coupler is optically coupled to said wavelength-selecting means by an optical fiber, and wherein said fourth O-port of said fiber-optic coupler provides an output-port.

30. The tunable laser of claim 29 further comprising an auxiliary fiber-optic coupler, in optical communication with said third O-port of said fiber-optic coupler and said optical fiber, whereby a fraction of a back-coupled beam is diverted to an auxiliary output-port.

31. The tunable laser of claim 1 wherein said splitting-combining means further provides one or more output-ports.

32. The tunable laser of claim 31 wherein said splitting-combining means diverts a fraction of a forward-coupled beam to said one or more output-ports.

33. The tunable laser of claim 1 further comprising an output-element optically coupled to said splitting-combining means, thereby providing one or more output-ports.

34. The tunable laser of claim 33 wherein said output-element diverts a fraction of a back-coupled beam to said one or more output-ports.

35. The tunable laser of claim 1 further comprising an auxiliary splitting-combining means, wherein said gain elements are optically coupled to said auxiliary splitting-combining means in parallel, and said auxiliary splitting-combining means is in optical communication with said wavelength-selecting means.

36. The tunable laser of claim 35 wherein each of said gain elements comprises a semiconductor diode having first and second end-faces, wherein said first end-face is in optical communication with said splitting-combining means, and wherein said second end-face is in optical communication with said auxiliary splitting-combining means.

37. The tunable laser of claim 35 wherein said auxiliary splitting-combining means comprises one or more elements selected from the group consisting of fiber-optic couplers, WDM couplers, wavelength routers, and active-switching elements.

38. A method of constructing and operating a tunable laser for producing a wide range of wavelengths, comprising:

a) selecting a plurality of gain elements with a plurality of gain spectra, wherein at least two of said gain spectra are distinct;

b) optically coupling said gain elements to a splitting-combining means in a parallel fashion;

c) further optically coupling said splitting-combining means to a wavelength-selecting means via an axial-mode structure configured for substantially reducing mode hops in said tunable laser; and d) operating said wavelength-selecting means in such a way that a selected beam with a selected wavelength is transmitted from said wavelength-selecting means back to said splitting-combining means, whereby said selected beam is routed to and further amplified by at least one of said gain elements and such that said selected beam is created in said tunable laser with a substantially continuously selectable wavelength along a range spanning up to said at least two gain spectra.

39. The method of claim 38 wherein said gain spectra are selected such that a superposition of said gain spectra in wavelength has a predetermined pattern.

40. The method of claim 39 wherein said at least two of said gain spectra are partially overlapping.

41. The method of claim 40 wherein said gain spectra are partially overlapping in a successive manner along wavelength.

42. The method of claim 39 wherein said at least two of said gain spectra are substantially non-overlapping.

43. The method of claim 42 wherein said gain spectra are substantially non-overlapping in wavelength.

44. The method of claim 38 further comprising the steps of dividing said gain elements into two or more groups according to a predetermined scheme, and switching off said two or more groups in an alternating manner while performing said step c).

45. The method of claim 38 further comprising the step of controlling said axial-mode structure of a laser cavity of said tunable laser.

46. The method of claim 45 wherein said axial-mode structure is controlled by an optical length of said laser cavity of said tunable laser.

47. The method of claim 46 further comprising the step of using an optical fiber to couple said splitting-combining means to said wavelength-selecting means, whereby a length of said optical fiber controls said axial-mode structure.

48. The method of claim 45 wherein said axial-mode structure is controlled by an active-modulation means.

49. The method of claim 45 wherein said axial-mode structure is controlled by a dispersive means.

50. The method of claim 38 further comprising the step of diverting a fraction of said selected beam with said selected wavelength to an output-port.

51. The method of claim 38 wherein splitting-combining means comprises one or more elements selected from the group consisting of fiber-optic couplers, WDM couplers, wavelength routers, and active-switching elements.

* * * * *